US012787221B2

(12) United States Patent
Wang et al.

(10) Patent No.: US 12,787,221 B2
(45) Date of Patent: Nov. 3, 2026

(54) IMMERSION COOLING SYSTEM AND RELATED IMMERSION COOLING METHOD

(71) Applicant: Wiwynn Corporation, New Taipei City (TW)

(72) Inventors: Hsien-Yu Wang, New Taipei City (TW); Cheng-Kuang Hsieh, New Taipei City (TW); Chia-Hung Yen, New Taipei City (TW)

(73) Assignee: Wiwynn Corporation, New Taipei City (TW)

( * ) Notice: Subject to any disclaimer, the term of this patent is extended or adjusted under 35 U.S.C. 154(b) by 562 days.

(21) Appl. No.: 18/242,516

(22) Filed: Sep. 5, 2023

(65) Prior Publication Data

US 2024/0365509 A1 Oct. 31, 2024

(30) Foreign Application Priority Data

Apr. 26, 2023 (TW) ................................ 112115519

(51) Int. Cl.
*H05K 7/20* (2006.01)
*G06F 11/07* (2006.01)
*H04L 43/10* (2022.01)

(52) U.S. Cl.
CPC ..... *H05K 7/20281* (2013.01); *G06F 11/0757* (2013.01); *H04L 43/10* (2013.01); *H05K 7/20236* (2013.01)

(58) Field of Classification Search
CPC ............ G06F 11/0757; G06F 11/0706; G06F 11/0721; G06F 11/0724; G06F 11/0727; H05K 7/20281; H05K 7/20236
See application file for complete search history.

(56) References Cited

U.S. PATENT DOCUMENTS

2002/0188873 A1* 12/2002 Berglund .................. G06F 1/28 714/25
2006/0015537 A1* 1/2006 Marks ................. H04L 67/1097
2008/0184074 A1* 7/2008 Smith ................. G06F 11/0727 714/E11.178
2013/0151829 A1* 6/2013 Amann .................. G06F 12/00 713/2
2017/0010822 A1* 1/2017 Ho .......................... G06F 11/00
(Continued)

*Primary Examiner* — Ashish Thomas
*Assistant Examiner* — Catherine Marie Nguyen
(74) *Attorney, Agent, or Firm* — Winston Hsu

(57) ABSTRACT

An immersion cooling system includes a cooling tank, a sensor and two control chips. The first control chip includes a first heartbeat circuit configured to periodically send a first heartbeat signal, a first watchdog circuit configured to real-time monitor the status of the first control circuit and a second heartbeat signal, a first data sensing port for selectively reading data measured by the sensor, and a first data transmitting port for selectively outputting data read by the first data sensing port. The second control chip includes a second heartbeat circuit configured to periodically send the second heartbeat signal, a second watchdog circuit configured to real-time monitor the status of the second control circuit and the first heartbeat signal, a second data sensing port for selectively reading data measured by the sensor, and a second data transmitting port for selectively outputting data read by the second data sensing port.

42 Claims, 15 Drawing Sheets

(56) References Cited

U.S. PATENT DOCUMENTS

| | | | | |
|---|---|---|---|---|
| 2019/0166726 | A1* | 5/2019 | Tung | G01F 25/10 |
| 2020/0011339 | A1* | 1/2020 | Li | F04D 27/004 |
| 2022/0374005 | A1* | 11/2022 | Maki | G05B 19/4184 |

* cited by examiner

IMMERSION COOLING SYSTEM AND RELATED IMMERSION COOLING METHOD

BACKGROUND OF THE INVENTION

1. Field of the Invention

The present invention is related to an immersion cooling system and a related immersion cooling method, and more particularly, to an immersion cooling system and a related immersion cooling method which can provide backup scheme and failure alarm function.

2. Description of the Prior Art

There are two primary types of cooling systems for computers: air cooling and liquid cooling. An air cooling system generally consists of two parts: a heat sink and a fan. The fan sits either on top or to the side of the heat sink and pushes the air away from the components in order to cool the components down. A liquid cooling system typically consists of water blocks, a pump, a radiator, pipes, and optionally a reservoir. The pump pushes the liquid coolant to and from a radiator through the water block, which is attached to the component. The heat is then transferred from the component to the cool liquid, which is then continuously pumped throughout the system.

Immersion cooling is one type of liquid cooling technique, with which electronic components are mostly or fully submerged in a thermally conductive but electrically insulating liquid coolant. Heat is removed from electronic components by putting the coolant in direct contact with hot components, and circulating the heated liquid through heat exchangers. Since an immersion cooling system does not require additional active cooling such as cooling fins, heat pipes or fans, it can greatly improve energy efficiency.

There are two types of immersion cooling, which work in slightly different ways. In a single-phase immersion cooling system, electronic components are immersed in a thermally conductive dielectric coolant and cooled by the natural convection phenomena, wherein the coolant always remains in liquid state without evaporating or freezing. The warm coolant in the tank may be pumped out by the coolant distribution unit, thereby transferring the heat to a heat exchanger. In a two-phase immersion cooling system, electronic components are submerged in a thermally conductive dielectric coolant which changes states during the cooling process. As the coolant reaches its boiling point, the vapor bubbles rise to the top and enter a gaseous state. After evaporating, the vapor comes in contact with a condenser that returns it back to its liquid state, which drips back into the cooling tank to be recycled through the system.

In a prior-art immersion cooling system, multiple sensors are disposed in the cooling tank for monitoring the temperature of the coolant, and a management module is configured to control the cooling process based on the data measured by the sensors, wherein the management module, all sensors in the cooling tanks and related sub-systems are usually designed with backup schemes. When the first group encounters a single device failure, the prior-art immersion cooling system is configured to switch to the second group. When the backup function is activated, related devices in the first group are in an idle state, which prevents the prior-art immersion cooling system from operating with the optimized efficiency and thus unable to comply with environmental/social/governance (ESG) regulations.

Meanwhile, the prior-art immersion cooling system only provides a fixed backup scheme. A full backup scheme may be overqualified in several applications, while a backup scheme with lower level may not meet the requirement of all applications. Therefore, there is a need of an immersion cooling system with a flexible backup scheme.

SUMMARY OF THE INVENTION

The present invention provides an immersion cooling system which includes a cooling tank, a sensor and a management module. The sensor is disposed in the cooling tank and configured to measure a parameter of the cooling tank during operation. The management module includes a first control chip and a second control chip. The first control chip includes a first heartbeat circuit configured to periodically send a first heartbeat signal, a first watchdog circuit configured to real-time monitor a status of the first control circuit and a second heartbeat signal, a first data sensing port configured to selectively read data measured by the first sensor, and a first data transmitting port configured to selectively output data read by the first data sensing port. The second control chip includes a second heartbeat circuit configured to periodically send the second heartbeat signal, a second watchdog circuit configured to real-time monitor a status of the second control circuit and the first heartbeat signal, a second data sensing port configured to selectively read the data measured by the first sensor, and a second data transmitting port configured to selectively output data read by the second data sensing port.

The present invention also provides a method of controlling an immersion cooling process. The method includes disposing a first sensor in a cooling tank for measuring a parameter of the cooling tank during operation; periodically sending a first heartbeat signal using a first control chip of a first management module; real-time monitoring a status of the first control circuit and a second heartbeat signal using the first control chip of the first management module; selectively reading data measured by the first sensor using a first data sensing port in the first control chip of the first management module; selectively outputting data read by the first data sensing port using a first data transmitting port in the first control chip of the first management module; periodically sending the second heartbeat signal using a second control chip of the first management module; real-time monitoring a status of the second control circuit and the first heartbeat signal using the second control chip of the first management module; selectively reading data measured by the first sensor using a second data sensing port in the second control chip of the first management module; and selectively outputting data read by the second data sensing port using a second data transmitting port in the second control chip of the first management module. The first control chip reads and outputs the data measured by the first sensor when determining that the first control chip is able to operate normally. The second control chip reads and outputs the data measured by the first sensor when determining that the second control chip is unable to receive the first heartbeat signal and is able to operate normally.

The present invention also provides an immersion cooling system which includes a cooling tank, a first sensor, a second sensor, a first management module and a second management module. The first sensor and the second sensor are disposed in the cooling tank and configured to measure parameters of the cooling tank during operation. The first management module includes a first control chip and a first storage device. The first control chip includes a first heartbeat circuit configured to periodically send a first heartbeat signal, a first watchdog circuit configured to real-time monitor a status of the first control circuit and a second heartbeat signal, a first data sensing port configured to selectively read data measured by the first sensor, and a first data transmitting port configured to selectively output data read by the first data sensing port. The first storage device is configured to receive and store data outputted by the first data transmitting port. The second management module includes a second control chip and a second storage device. The second control chip includes a second heartbeat circuit configured to periodically send the second heartbeat signal, a second watchdog circuit configured to real-time monitor a status of the second control circuit and the first heartbeat signal, a second data sensing port configured to selectively read the data measured by the second sensor, and a second data transmitting port configured to selectively output data read by the second data sensing port. The second storage device is configured to receive and store data outputted by the second data transmitting port.

The present invention also provides a method of controlling an immersion cooling process. The method includes disposing a first sensor and a second sensor in a cooling tank for measuring parameters of the cooling tank during operation; periodically sending a first heartbeat signal using a first control chip of a first management module; real-time monitoring a status of the first control circuit and a second heartbeat signal using the first control chip of the first management module; selectively reading data measured by the first sensor using a first data sensing port in the first control chip of the first management module; selectively outputting data read by the first data sensing port using a first data transmitting port in the first control chip of the first management module; periodically sending the second heartbeat signal using a second control chip of a second management module; real-time monitoring a status of the second control circuit and the first heartbeat signal using the second control chip of the second management module; selectively reading data measured by the second sensor using a second data sensing port in the second control chip of the second management module; and selectively outputting data read by the second data sensing port using a second data transmitting port in the second control chip of the second management module. The first control chip reads and outputs the data measured by the first sensor when determining that the first control chip is able to operate normally. The second control chip reads and outputs the data measured by the second sensor when determining that the second control chip is unable to receive the first heartbeat signal and is able to operate normally.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
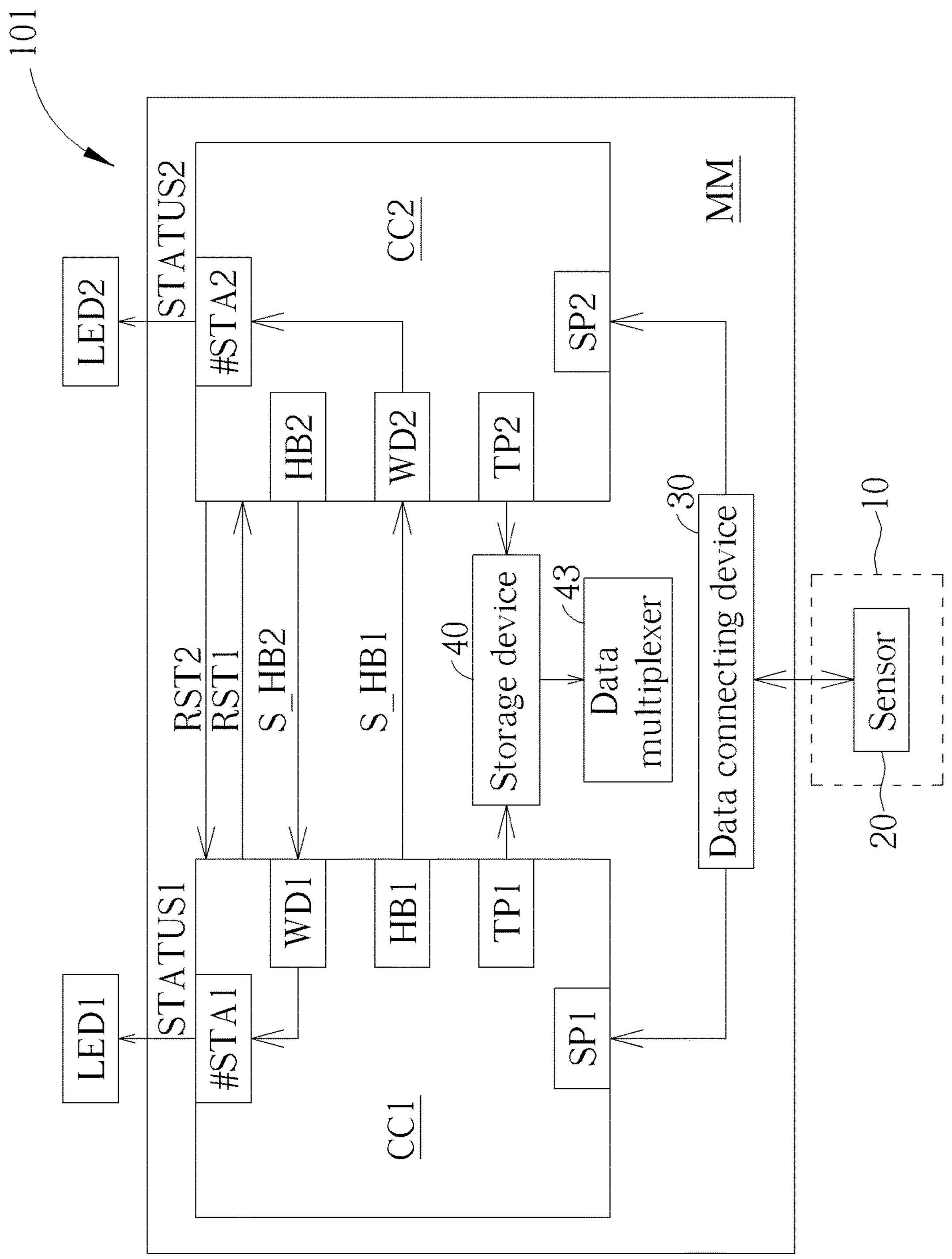
FIG. 1A is a diagram illustrating an immersion cooling system according to an embodiments of the present application.
Figure 1B:
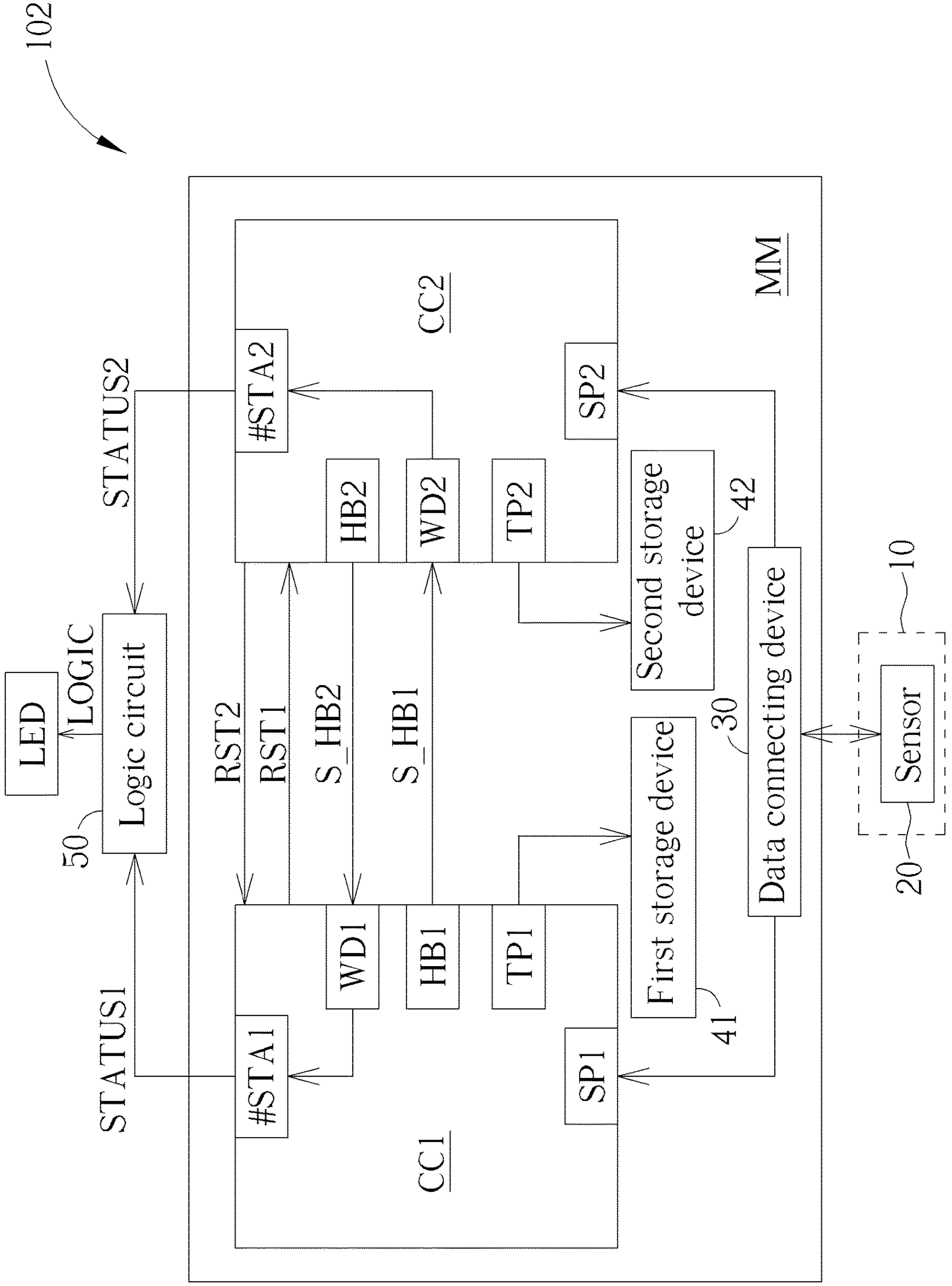
FIG. 1B is a diagram illustrating an immersion cooling system according to another embodiments of the present application.
Figure 1C:
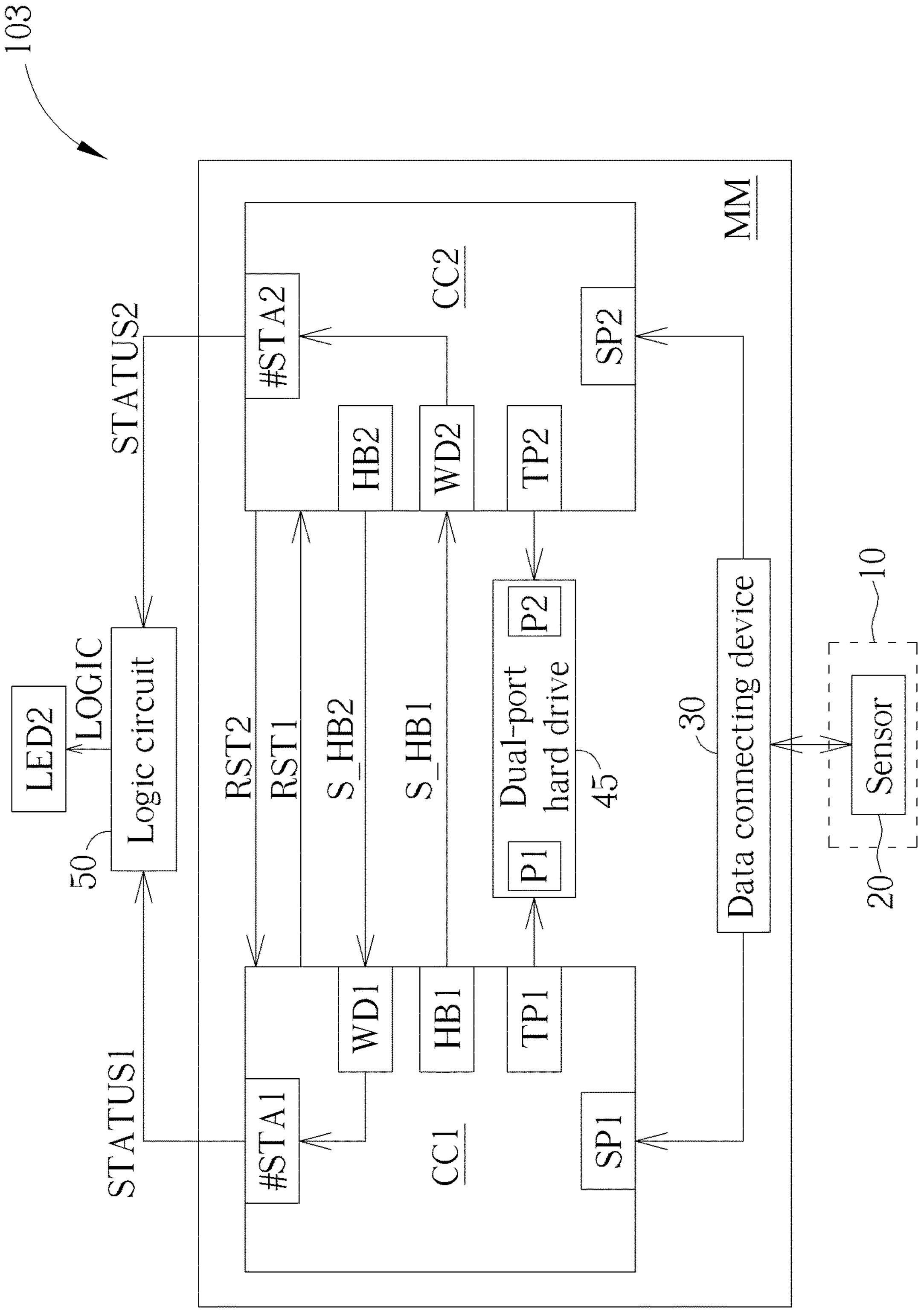
FIG. 1C is a diagram illustrating an immersion cooling system according to another embodiments of the present application.

FIGS. 1A-1C are diagrams illustrating immersion cooling systems 101-103 according to embodiments of the present application. Each of the immersion cooling systems 101-103 includes a cooling tank 10, at least one sensor 20, and a management module MM. In the immersion cooling systems 101-103 of the present invention, the management module MM includes a first control chip CC1 and a second control chip CC2. Functioning as the main control chip of the management module MM, the first control chip CC1 includes a first heartbeat circuit HB1, a first watchdog circuit WD1, a first data sensing port SP1, a first data transmitting port TP1 and a first status output port #STA1. Functioning as the backup control chip of the management module MM, the second control chip CC2 includes a second heartbeat circuit HB2, a second watchdog circuit WD2, a second data sensing port SP2, a second data transmitting port TP2 and a second status output port #STA2. The immersion cooling systems 101-103 of the present invention can provide backup scheme and failure alarm function in 1×2 mode: when determining that all devices are able to operate normally, the management module MM is configured to control the immersion cooling process using the first control chip CC1 (the main control chip); when determining that the first control chip CC1 is unable to operate normally but the second control chip CC2 is able to operate normally, the management module MM is configured to control the immersion cooling process using the second control chip CC2 (the backup control chip); when determining that the first control chip CC1 and/or the second control chip CC2 is unable to operate normally, the management module MM is configured to send an alarm signal.

Figure 2A:
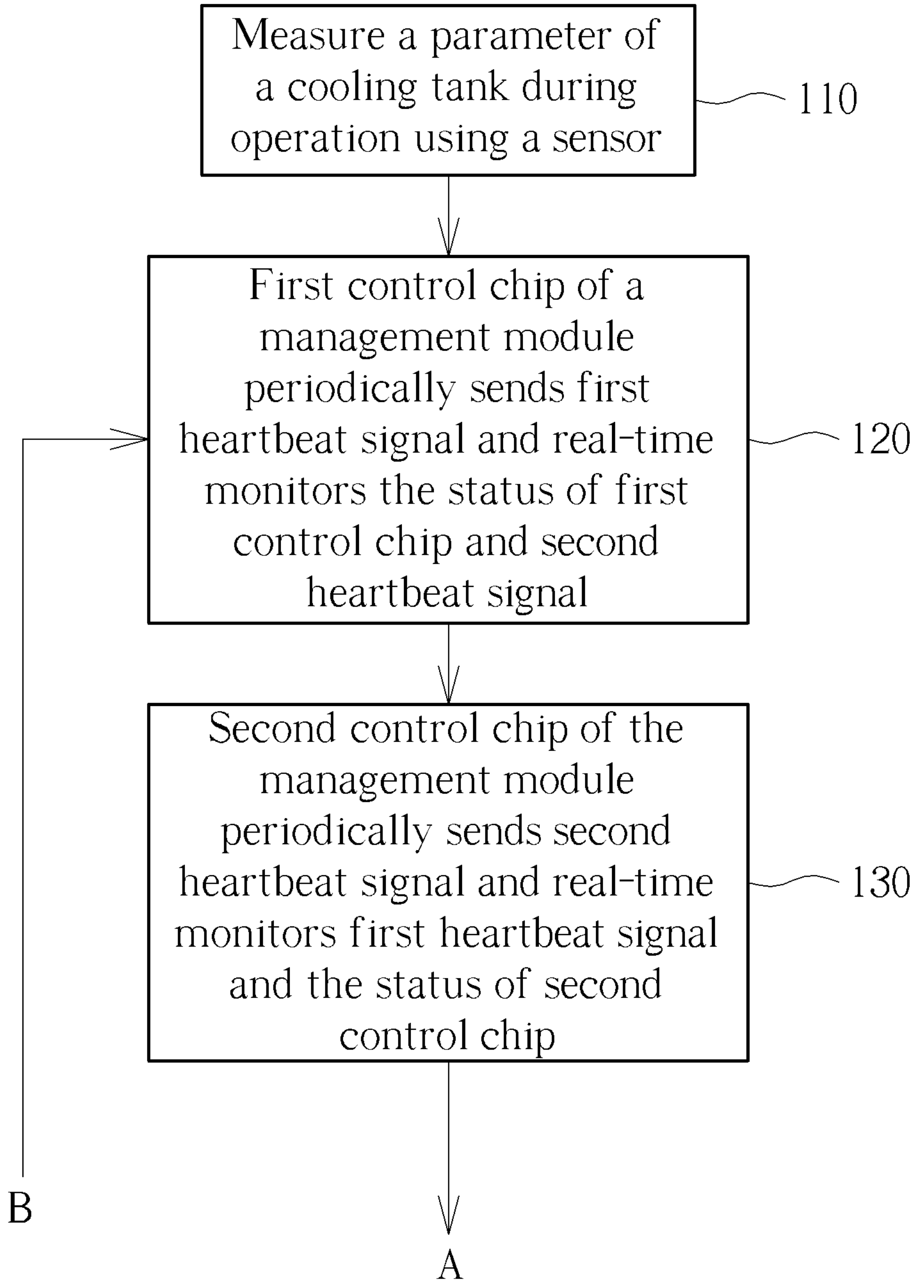
FIGS. 2A and 2B depict a flowchart illustrating the operation of an immersion cooling system according to embodiments of the present application.
Figure 2B:
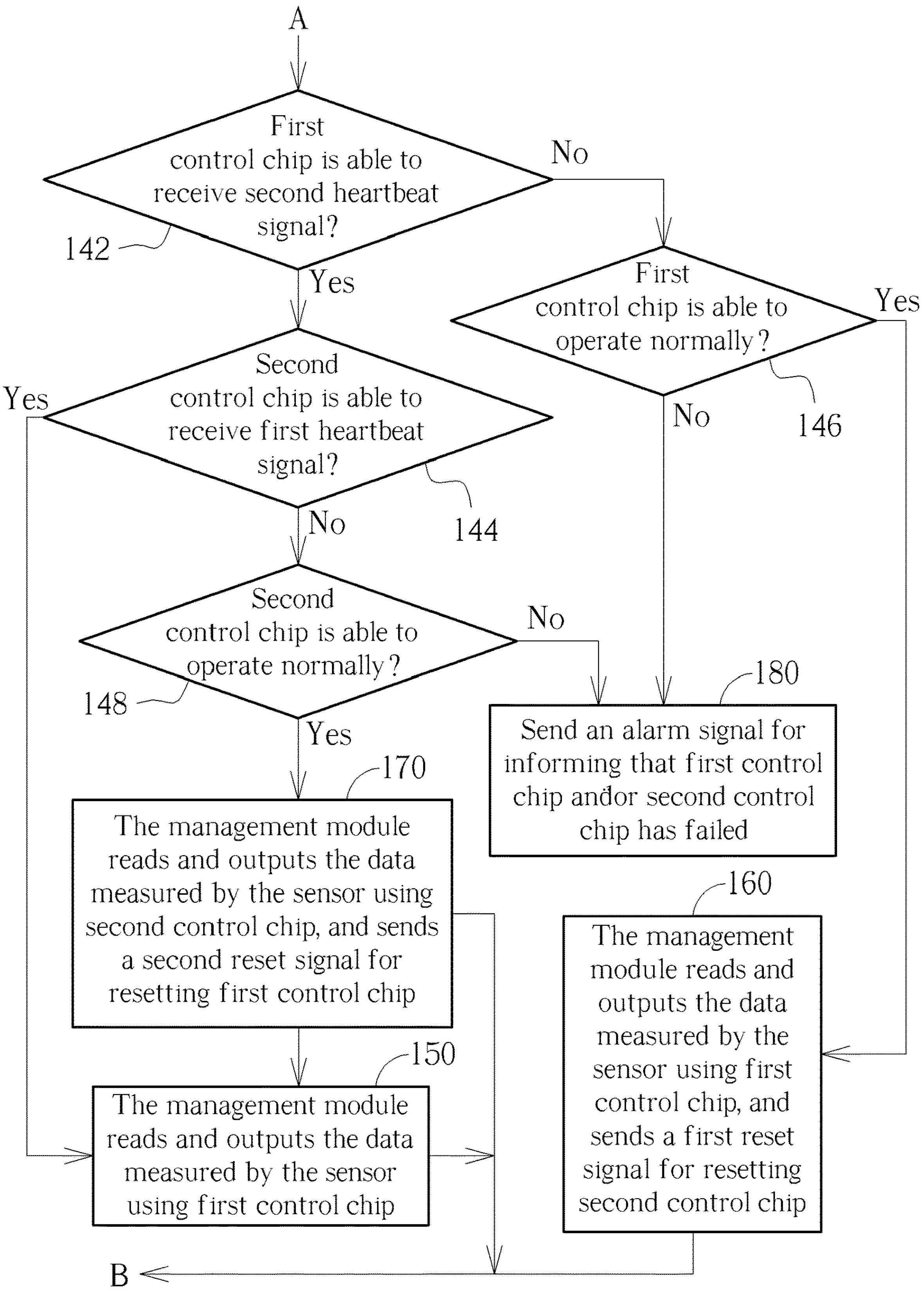

FIGS. 2A and 2B depict a flowchart illustrating the operation of the immersion cooling systems 101-103 according to embodiments of the present application. The flowchart depicted in FIGS. 2A and 2B includes the following steps:

Step 110: dispose at least one sensor 20 in the cooling tank 10 for measuring a parameter of the cooling tank 10 during operation.

Step 120: the first control chip CC1 of the management module MM periodically sends a first heartbeat signal S_HB1 and real-time monitors the status of the first control chip CC1 and a second heartbeat signal S_HB2.

Step 130: the second control chip CC2 of the management module MM periodically sends the second heartbeat signal S_HB2 and real-time monitors the first heartbeat signal S_HB1 and the status of the second control chip CC2.

Step 142: determine whether the first control chip CC1 is able to receive the second heartbeat signal S_HB2; if yes, execute step 144; if no, execute step 146.

Step 144: determine whether the second control chip CC2 is able to receive the first heartbeat signal S_HB1; if yes, execute step 150; if no, execute step 148.

Step 146: determine whether the first control chip CC1 is able to operate normally; if yes, execute step 160; if no, execute step 180.

Step 148: determine whether the second control chip CC2 is able to operate normally; if yes, execute step 170; if no, execute step 180.

Step 150: the management module MM reads and outputs the data measured by the sensor 20 using the first control chip CC1; execute step 120.

Step 160: the management module MM reads and outputs the data measured by the sensor 20 using the first control chip CC1, and sends a first reset signal RST 1 for resetting the second control chip CC2; execute step 120.

Step 170: the management module MM reads and outputs the data measured by the sensor 20 using the second control chip CC2, and sends a second reset signal RST2 for resetting the first control chip CC1; execute step 120.

Step 180: send an alarm signal for informing that the first control chip CC1 and/or the second control chip CC2 has failed.

In step 110, at least one sensor 20 is disposed in the cooling tank 10 of the immersion cooling systems 101-103 for measuring the parameter of the cooling tank 10 during operation, such as measuring the temperature of the cooling tank 10 during operation.

In the management module MM of the immersion cooling systems 101-103 according to embodiments of the present invention, the first heartbeat circuit HB1 in the first control circuit CC1 is coupled to the second watchdog circuit WD2 in the second control circuit CC2, and the second heartbeat circuit HB2 in the second control circuit CC2 is coupled to the first watchdog circuit WD1 in the first control circuit CC1. In step 120, the first control chip CC1 of the management module MM is configured to periodically send the first heartbeat signal S_HB1 and real-time monitor the status of the first control chip CC1 and the second heartbeat signal S_HB2. In step 130, the second control chip CC2 of the management module MM is configured to periodically send the second heartbeat signal S_HB2 and real-time monitor the first heartbeat signal S_HB1 and the status of the second control chip CC2.

In an embodiment, the first control chip CC1 of the management module MM is configured to monitor its first heartbeat signal S_HB1 and monitor the second heartbeat signal S_HB2 via the first watchdog circuit WD1 on a real-time basis, thereby real-time monitoring its own status and the status of the second control chip CC2; the second control chip CC2 of the management module MM is configured to monitor its second heartbeat signal S_HB2 and monitor the first heartbeat signal S_HB1 via the second watchdog circuit WD2 on a real-time basis, thereby real-time monitoring its own status and the status of the first control chip CC1. In another embodiment, the first control chip CC1 of the management module MM is configured to real-time monitor its own status using software, and the second control chip CC2 of the management module MM is configured to real-time monitor its own status using software. However, the method adopted by the first control chip CC1 or the second control chip CC2 of the management module MM to real-time monitor its own status does not limit the scope of the present invention.

In step 142, it is determined whether the first control chip CC1 of the management module MM is able to receive the second heartbeat signal S_HB2. In step 144, it is determined whether the second control chip CC2 of the management module MM is able to receive the first heartbeat signal S_HB1. In step 146, it is determined whether the first control chip CC1 of the management module MM is able operate normally. In step 148, it is determined whether the second control chip CC2 of the management module MM is able to operate normally.

In an embodiment, when it is determined that the first control chip CC1 of the management module MM is able to operate normally, the first control chip CC1 of the management module MM is configured to output a first status signal STATUS1 having a first voltage level (such as high voltage level) via its first status output port #STA1; when it is determined that the first control chip CC1 of the management module MM is unable to operate normally, the first control chip CC1 of the management module MM is configured to output a first status signal STATUS1 having a second voltage level (such as low voltage level) via its first status output port #STA1. Similarly, when it is determined that the second control chip CC2 of the management module MM is able to operate normally, the second control chip CC2 of the management module MM is configured to output a second status signal STATUS2 having a first voltage level (such as high voltage level) via its second status output port #STA2; when it is determined that the second control chip CC2 of the management module MM is unable to operate normally, the second control chip CC2 of the management module MM is configured to output the second status signal STATUS2 having a second voltage level (such as low voltage level) via its second status output port #STA2.

When it is determined in step 142 that the first control chip CC1 of the management module MM is able to receive the second heartbeat signal S_HB2 and it is then determined in step 144 that the second control chip CC2 of the management module MM is able to receive the first heartbeat signal S_HB1, it indicates that both the first control chip CC1 and the second control chip CC2 of the management module MM can operate normally. Under such circumstance, the immersion cooling systems 101-103 are configured to execute step 150 so that the management module MM reads and outputs the data measured by the sensor 20 using the first control chip CC1 (main control chip) for controlling the immersion cooling process. Next, the present method loops back to step 120 for continuing to real-time monitor the status of the first control chip CC1 and the second control chip CC2.

When it is determined in step 142 that the first control chip CC1 of the management module MM is unable to receive the second heartbeat signal S_HB2 and it is then determined in step 146 that the first control chip CC1 of the management module MM is able to operate normally, it indicates that the first control chip CC1 of the management module MM is able to operate normally but the second control chip CC2 of the management module MM is unable to operate normally. Under such circumstance, the immersion cooling systems 101-103 are configured to execute step 160 so that the management module MM reads and outputs the data measured by the sensor 20 using the first control chip CC1 (main control chip) for controlling the immersion cooling process. Meanwhile, the first control chip CC1 is configured to send the first reset signal RST1 for resetting the second control chip CC2. Next, the present method loops back to step 120 for continuing to real-time monitor the status of the first control chip CC1 and the second control chip CC2. If the second control chip CC2 is able to transmit the second heartbeat signal S_HB2 after being reset by the first reset signal RST1, it can be determined during the subsequent execution of steps 142-148 that the second control chip CC2 is able to operate normally for providing backup function when requested.

When it is determined in step 142 that the first control chip CC1 of the management module MM is unable to receive the second heartbeat signal S_HB2, but it is determined in steps 144 and 148 that the second control chip CC2 of the management module MM is unable to receive the first heartbeat signal S_HB1 and is able to operate normally, it indicates that the second control chip CC2 of the management module MM is able to operate normally but the first control chip CC1 of the management module MM is unable to operate normally. Under such circumstance, the immersion cooling systems 101-103 are configured to execute step 170 for activating backup function, so that the management module MM reads and outputs the data measured by the sensor 20 using the second control chip CC2 (backup control chip) for controlling the immersion cooling process. Meanwhile, the second control chip CC2 is configured to send the second reset signal RST2 for resetting the first control chip CC1. Next, the present method loops back to step 120 for continuing to real-time monitor the status of the first control chip CC1 and the second control chip CC2. If the first control chip CC1 is able to transmit the first heartbeat signal S_HB1 after being reset by the second reset signal RST2, it can be determined during the subsequent execution of steps 142-148 that the first control chip CC1 is able to operate normally. Under such circumstance, the management module MM reads and outputs the data measured by the sensor 20 using the first control chip CC1 again for controlling the immersion cooling process, while the second control chip CC2 stops reading and outputting the data measured by the sensor 20 for deactivating the backup function.

When the present immersion cooling systems 101-103 execute step 150, 160 or 170, the first data sensing port SP1 of the first control chip CC1 in the management module MM may be coupled to the sensor 20 via a data connecting device 30, thereby selectively reading and outputting the data measured by the sensor 20; the second data sensing port SP2 of the second control chip CC2 in the management module MM may be coupled to the sensor 20 via the data connecting device 30, thereby selectively reading and outputting the data measured by the sensor 20. In an embodiment, the data connecting device 30 may be a multiplexer and a hub, but not limited thereto.

In the embodiment depicted in FIG. 1A, the immersion cooling system 101 further includes a data multiplexer 40 and a storage device 43. The data multiplexer 40 is coupled to the first data transmitting port TP1 of the first control chip CC1 and the second data transmitting port TP2 of the second control chip CC2 for receiving data outputted by the first data transmitting port TP1 and the second data transmitting port TP2 and for selectively outputting data received from the first data transmitting port TP1 or the second data transmitting port TP2. The storage device 43 is coupled to the data multiplexer 40 for receiving data outputted by the data multiplexer 40. In an embodiment, the data multiplexer 40 may be a universal serial bus (USB) multiplexer and the storage device 43 may be a flash memory, but not limited thereto. In an embodiment, the storage device 43 may store and name each piece of data according to data receiving time, or store each piece of data as a metastable, but not limited thereto.

In the embodiment depicted in FIG. 1B, the immersion cooling system 102 further includes a first storage device 41 and a second storage device 42. The first storage device 41 is coupled to the first data transmitting port TP1 of the first control chip CC1 for receiving and storing data outputted by the first data transmitting port TP1. The second storage device 42 is coupled to the second data transmitting port TP2 of the second control chip CC2 for receiving and storing data outputted by the second data transmitting port TP2. In an embodiment, each of the first storage device 41 and the second storage device 42 may be a secure digital (SD) memory card, a secure digital input/output interface (SDIO) memory card, or an embedded multimedia card (eMMC), but not limited thereto. In an embodiment, each of the first storage device 41 and the second storage device 42 may adopt a redundant array of independent disks (RAID) structure, but not limited thereto. In an embodiment, each of the first storage device 41 and the second storage device 42 may store and name each piece of data according to data receiving time, or store each piece of data as a metastable, but not limited thereto.

In the embodiment depicted in FIG. 1C, the immersion cooling system 103 further includes a dual-port hard drive 45 having a first data port P1 and a second data port P2. The first data port P1 is coupled to the first data transmitting port TP1 of the first control chip CC1 and the second data port P2 is coupled to the second data transmitting port TP2 of the second control chip CC2 for receiving and storing data outputted by the first data transmitting port TP1 and the second data transmitting port TP2. In an embodiment, the dual-port hard drive 45 may be a serial attached small computer system interface (SAS) hard drive or a non-volatile memory express (NVMe) hard drive, but not limited thereto. In an embodiment, the dual-port hard drive 45 may adopt a RAID structure, but not limited thereto. In an embodiment, the dual-port hard drive 45 may store and name each piece of data according to data receiving time, or store each piece of data as a metastable, but not limited thereto.

When it is determined in step 142 that the first control chip CC1 of the management module MM is able to receive the second heartbeat signal S_HB2, but it is determined in steps 144 and 148 that the second control chip CC2 of the management module MM is unable to receive the first heartbeat signal S_HB1 and is unable to operate normally, it indicates that both the first control chip CC1 and the second control chip CC2 of the management module MM are unable to operate normally. When it is determined in step 142 that the first control chip CC1 of the management module MM is unable to receive the second heartbeat signal S_HB2 and then in step 146 that the first control chip CC1 of the management module MM is unable to operate normally, it indicates that both the first control chip CC1 and the second control chip CC2 of the management module MM are unable to operate normally. In the above-mentioned two cases, the immersion cooling systems 101-103 are configured to execute step 180 for sending an alarm signal, thereby informing that the first control chip CC1 and/or the second control chip CC2 has failed.

In the embodiment depicted in FIG. 1A, the immersion cooling system 101 further includes a first alarm device LED1 and a second alarm device LED2. The first alarm device LED1 is coupled to the first status output port #STA1 and configured to selectively send a first alarm signal based on the first status signal STATUS1. The second alarm device LED2 is coupled to the second status output port #STA2 and configured to selectively send a second alarm signal based on the second status signal STATUS2. More specifically, when determining that the first control chip CC1 is unable to operate normally based on the first status signal STATUS1 (such as when the first status signal STATUS1 is at the second voltage level), the first alarm device LED1 is configured to send the first alarm signal; when determining that the second control chip CC2 is unable to operate normally based on the second status signal STATUS2 (such as when the second status signal STATUS2 is at the second voltage level), the second alarm device LED2 is configured to send the second alarm signal.

In the embodiments depicted in FIGS. 1B and 1C, each of the immersion cooling systems 102 and 103 further includes an alarm device LED and a logic circuit 50. The logic circuit 50, coupled to the first status output port #STA1 of the first control chip CC1 and the second status output port #STA2 of the second control chip CC2, is configured to output a logic signal LOGIC base on the first status signal STATUS1 and the second status signal STATUS2. The alarm device LED is coupled to the logic circuit 50 and configured to selectively send an alarm signal based on a logic signal LOGIC. More specifically, when determining that both the first control chip CC1 and the second control chip CC2 are unable to operate normally based on the first status signal STATUS1 and the second status signal STATUS2 (such as when the first status signal STATUS1 and the second status signal STATUS2 are both at the second voltage level), the logic circuit 50 is configure to output the logic signal LOGIC having a third voltage level (such as high voltage level), thereby instructing the alarm device LED to send the alarm signal; when determining that at least one of the first control chip CC1 and the second control chip CC2 is able to operate normally based on the first status signal STATUS1 and the second status signal STATUS2 (such as when at least one of the first status signal STATUS1 and the second status signal STATUS2 is at the first voltage level), the logic circuit 50 is configure to output the logic signal LOGIC having a fourth voltage level (such as low voltage level), thereby instructing the alarm device LED not to send the alarm signal.

It is noteworthy that the immersion cooling system 101 depicted in FIG. 1A may also adopt the alarm scheme using individual alarm devices as depicted in FIGS. 1B and 1C, and that the immersion cooling systems 102 and 103 depicted in FIGS. 1B and 1C may also adopt the alarm scheme using a single alarm device as depicted in FIG. 1A. In an embodiment, the alarm devices LED, LED1 and LED2 may be light-emitting diodes, but not limited thereto. In another embodiment, the alarm devices LED, LED1 and LED2 may be audio alarm device. However, the type of the alarm device does not limit scope of the present invention.

Figure 3A:
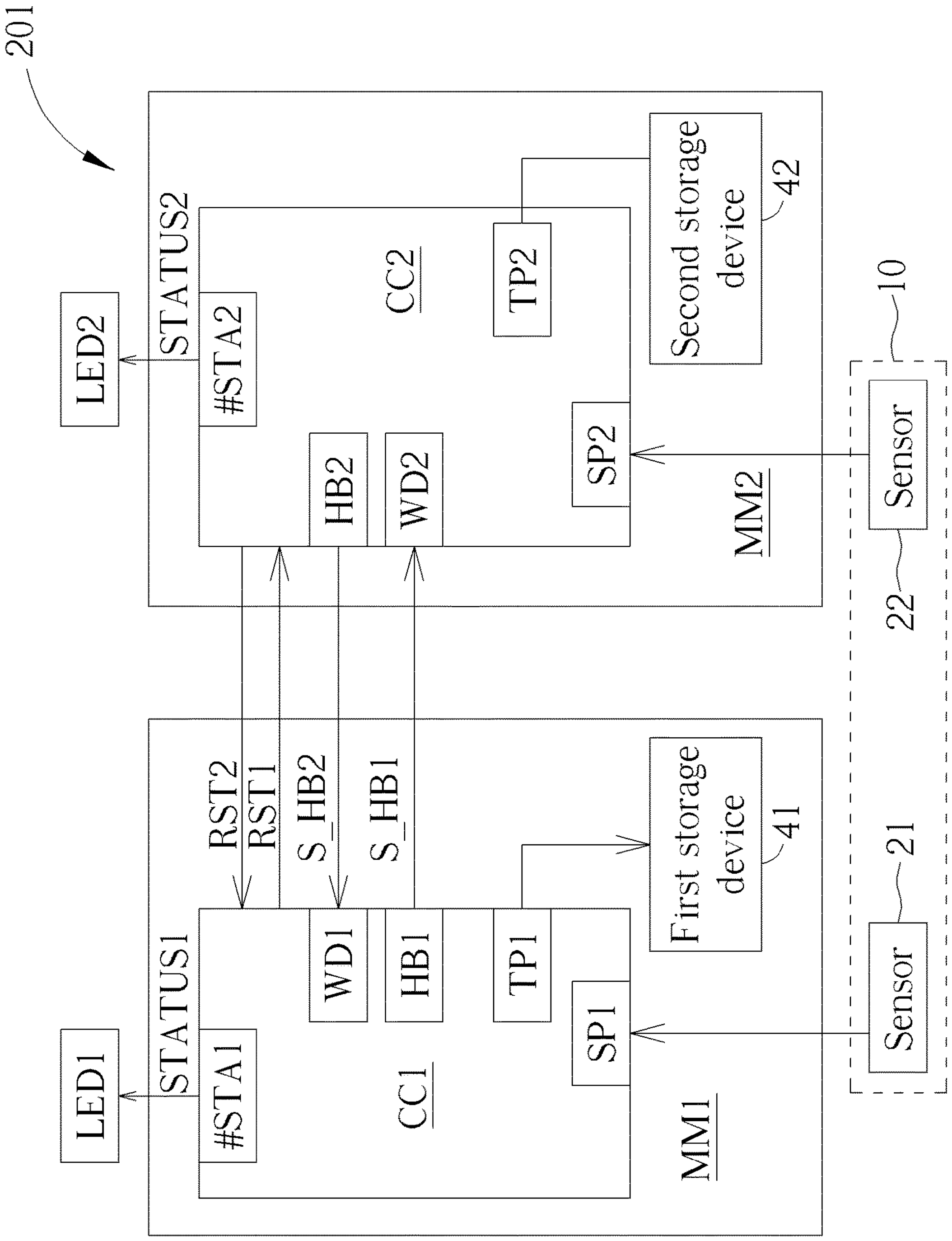
FIG. 3A is a diagram illustrating an immersion cooling system according to an embodiments of the present application.
Figure 3B:
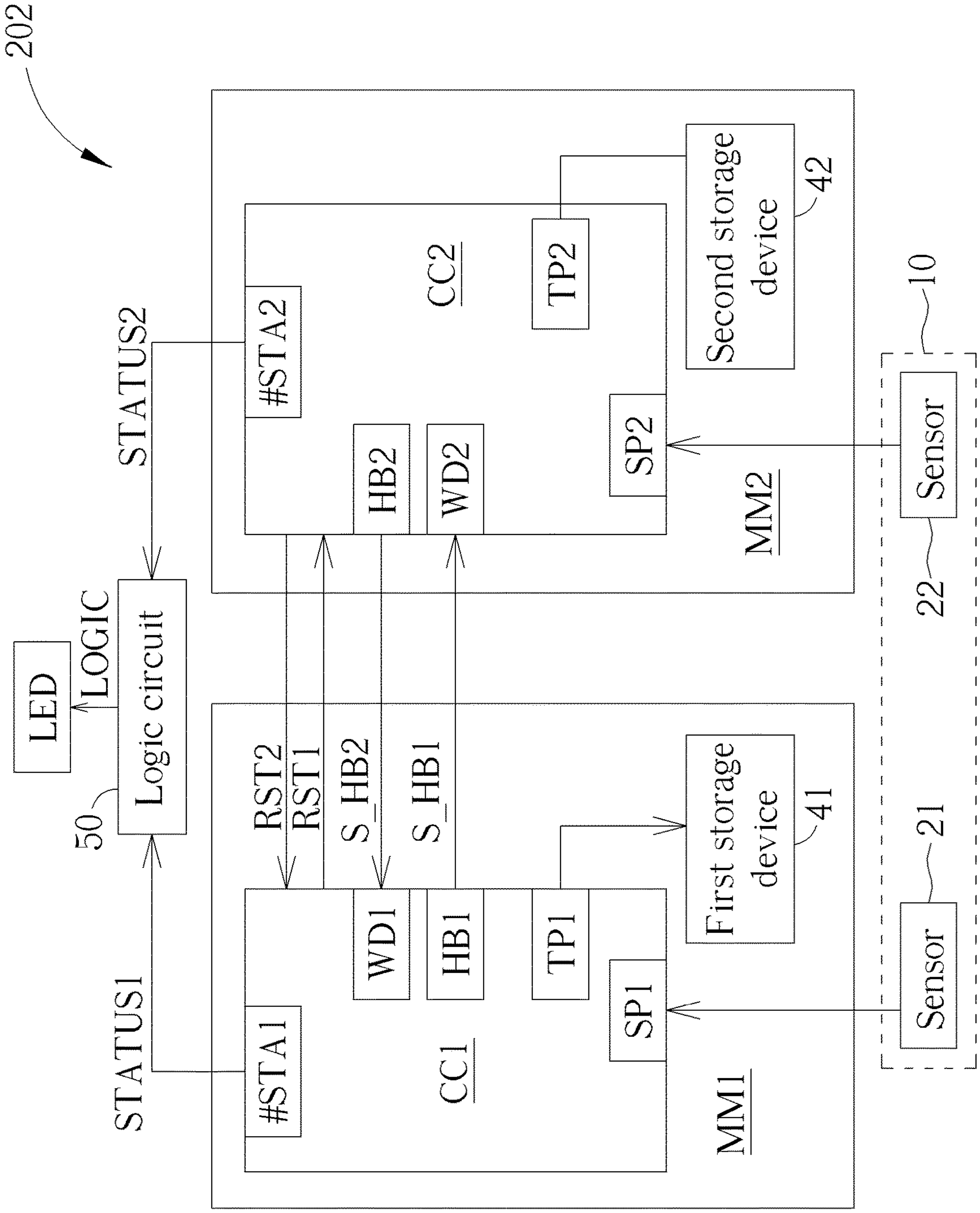
FIG. 3B is a diagram illustrating an immersion cooling system according to another embodiments of the present application.

FIGS. 3A and 3B are diagrams illustrating immersion cooling systems 201 and 202 according to embodiments of the present application. Each of the immersion cooling systems 201 and 202 includes a cooling tank 10, a plurality of sensors, and a plurality of management modules each including a control chip. For illustrative purposes, it is assumed that each of the immersion cooling systems 201 and 202 includes at least two sensors 21 and 22, and at least a first management module MM1 and a second management module MM2. The first management module MM1 functions as the main management module of the immersion cooling systems 201 and 202 and includes a first control chip CC1. The first control chip CC1 includes a first heartbeat circuit HB1, a first watchdog circuit WD1, a first data sensing port SP1, a first data transmitting port TP1 and a first status output port #STA1. The second management module MM2 functions as the backup management module of the immersion cooling systems 201 and 202 and includes a second control chip CC2. The second control chip CC2 includes a second heartbeat circuit HB2, a second watchdog circuit WD2, a second data sensing port SP2, a second data transmitting port TP2 and a second status output port #STA2. The immersion cooling systems 201 and 202 of the present invention can provide backup scheme and failure alarm function in 1+1 mode: when determining that all devices are able to operate normally, the first management module MM1 (the main management module) is configured to control the immersion cooling process using the first control chip CC1; when determining that the first management module MM1 is unable to operate normally but the second management module MM2 is able to operate normally, the second management module MM2 (the backup management module) is configured to control the immersion cooling process using the second control chip CC2; when determining that the first management module MM1 and/or the second management module MM2 is unable to operate normally, the immersion cooling systems 201 and 202 are configured to send an alarm signal.

Figure 4A:
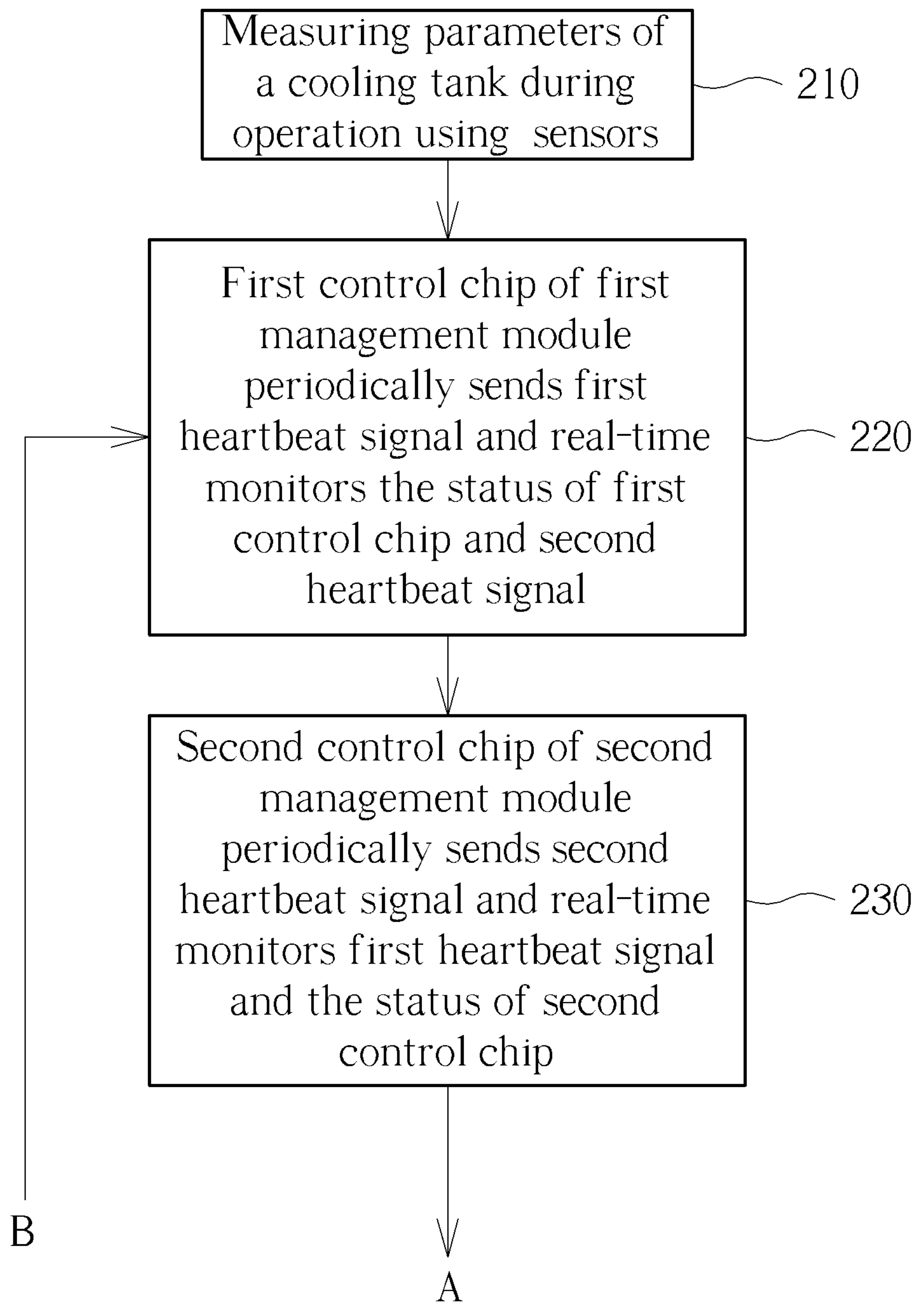
FIGS. 4A and 4B depict a flowchart illustrating the operation of an immersion cooling system according to embodiments of the present application.
Figure 4B:
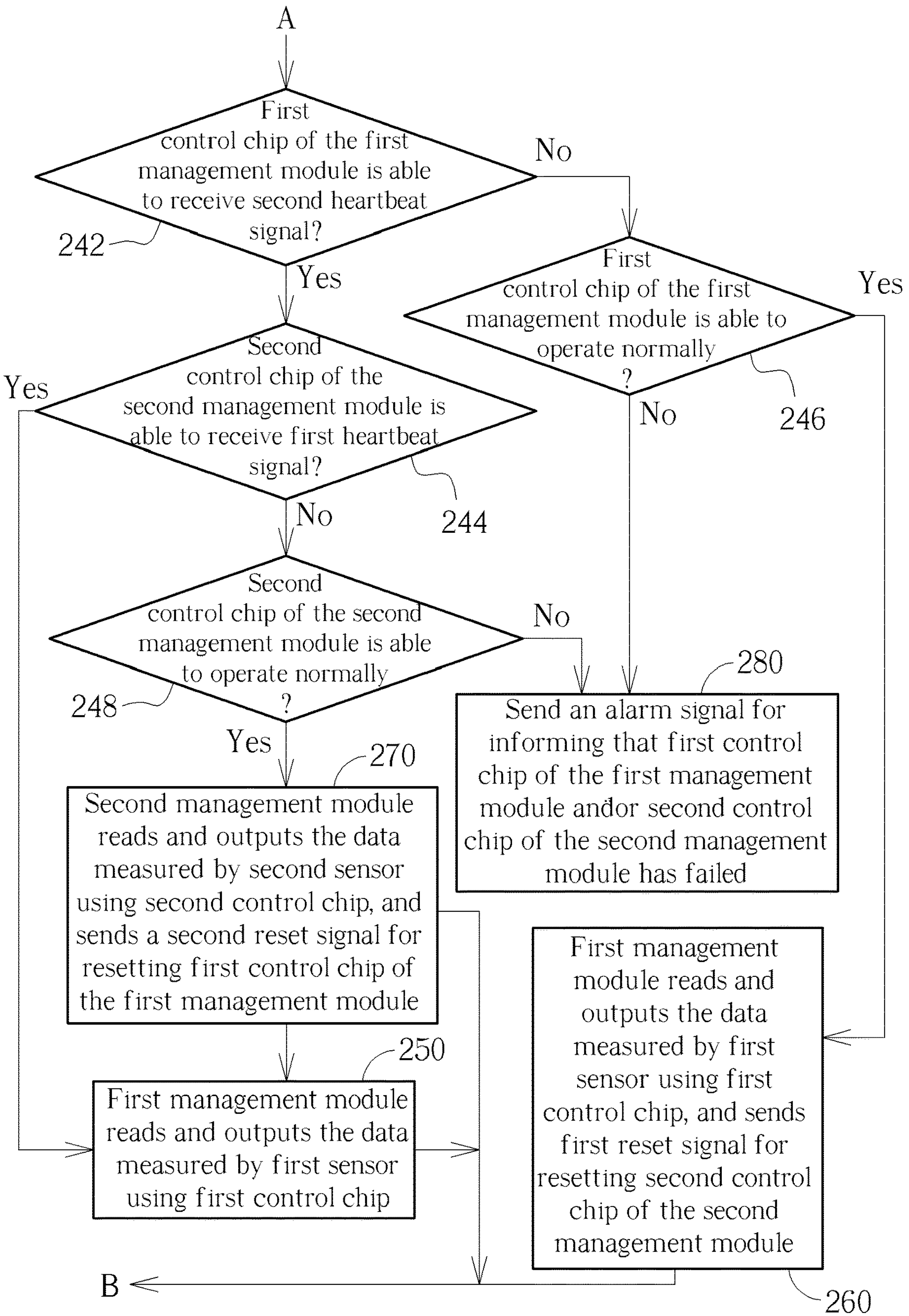

FIGS. 4A and 4B depict a flowchart illustrating the operation of the immersion cooling systems 201 and 202 according to embodiments of the present application. The flowchart depicted in FIGS. 4A and 4B includes the following steps:

Step 210: dispose the sensors 21 and 22 in the cooling tank 10 for measuring parameters of the cooling tank 10 during operation.

Step 220: the first control chip CC1 of the first management module MM1 periodically sends a first heartbeat signal S_HB1 and real-time monitors the status of the first control chip CC1 and a second heartbeat signal S_HB2.

Step 230: the second control chip CC2 of the second management module MM2 periodically sends the second heartbeat signal S_HB2 and real-time monitors the first heartbeat signal S_HB1 and the status of the second control chip CC2.

Step 242: determine whether the first control chip CC1 of the first management module MM1 is able to receive the second heartbeat signal S_HB2; if yes, execute step 244; if no, execute step 246.

Step 244: determine whether the second control chip CC2 of the second management module MM2 is able to receive the first heartbeat signal S_HB1; if yes, execute step 250; if no, execute step 248.

Step 246: determine whether the first control chip CC1 of the first management module MM1 is able to operate normally; if yes, execute step 260; if no, execute step 280.

Step 248: determine whether the second control chip CC2 of the second management module MM2 is able to operate normally; if yes, execute step 270; if no, execute step 280.

Step 250: the first management module MM1 reads and outputs the data measured by the sensor 21 using the first control chip CC1; execute step 220.

Step 260: the first management module MM1 reads and outputs the data measured by the sensor 21 using the first control chip CC1, and sends a first reset signal RST1 for resetting the second control chip CC2 of the second management module MM2; execute step 220.

Step 270: the second management module MM2 reads and outputs the data measured by the sensor 22 using the second control chip CC2, and sends a second reset signal RST2 for resetting the first control chip CC1 of the first management module MM1; execute step 220.

Step 280: send an alarm signal for informing that the first control chip CC1 of the first management module MM1 and/or the second control chip CC2 of the second management module MM2 has failed.

In step 210, at least two sensors 21 ad 22 are disposed in the cooling tank 10 of the immersion cooling systems 201 and 202 for measuring the parameters of the cooling tank 10 during operation. For example, the sensors 21 ad 22 may be disposed at different locations in the cooling tank 10 for measuring the temperatures of the cooling tank 10 at different locations.

In the immersion cooling systems 201 and 202 according to embodiments of the present invention, the first heartbeat circuit HB1 in the first control circuit CC1 of the first management module MM1 is coupled to the second watchdog circuit WD2 in the second control circuit CC2 of the second management module MM2, and the second heartbeat circuit HB2 in the second control circuit CC2 of the second management module MM2 is coupled to the first watchdog circuit WD1 in the first control circuit CC1 of the first management module MM1. In step 220, the first control chip CC1 of the first management module MM1 is configured to periodically send the first heartbeat signal S_HB1 and real-time monitor the status of the first control chip CC1 and the second heartbeat signal S_HB2. In step 230, the second control chip CC2 of the second management module MM2 is configured to periodically send the second heartbeat signal S_HB2 and real-time monitor the first heartbeat signal S_HB1 and the status of the second control chip CC2.

In an embodiment, the first control chip CC1 of the first management module MM1 is configured to monitor its first heartbeat signal S_HB1 and monitor the second heartbeat signal S_HB2 via the first watchdog circuit WD1 on a real-time basis, thereby real-time monitoring its own status and the status of the second control chip CC2 in the second management module MM2; the second control chip CC2 of the second management module MM2 is configured to monitor its second heartbeat signal S_HB2 and monitor the first heartbeat signal S_HB1 via the second watchdog circuit WD2 on a real-time basis, thereby real-time monitoring its own status and the status of the first control chip CC1 in the first management module MM1. In another embodiment, the first control chip CC1 of the first management module MM1 is configured to real-time monitor its own status using software, and the second control chip CC2 of the second management module MM2 is configured to real-time monitor its own status using software. However, the method adopted by the first control chip CC1 of the first management module MM1 or the second control chip CC2 of the second management module MM2 to real-time monitor its own status does not limit the scope of the present invention.

In step 242, it is determined whether the first control chip CC1 of the first management module MM1 is able to receive the second heartbeat signal S_HB2. In step 244, it is determined whether the second control chip CC2 of the second management module MM2 is able to receive the first heartbeat signal S_HB1. In step 246, it is determined whether the first control chip CC1 of the first management module MM1 is able operate normally. In step 248, it is determined whether the second control chip CC2 of the second management module MM2 is able to operate normally.

In an embodiment, when it is determined that the first control chip CC1 of the first management module MM1 is able to operate normally, the first control chip CC1 of the first management module MM1 is configured to output the first status signal STATUS1 having a first voltage level (such as high voltage level) via its first status output port #STA1; when it is determined that the first control chip CC1 of the first management module MM1 is unable to operate normally, the first control chip CC1 of the first management module MM1 is configured to output the first status signal STATUS1 having a second voltage level (such as low voltage level) via its first status output port #STA1. Similarly, when it is determined that the second control chip CC2 of the second management module MM2 is able to operate normally, the second control chip CC2 of the second management module MM2 is configured to output the second status signal STATUS2 having a first voltage level (such as high voltage level) via its second status output port #STA2; when it is determined that the second control chip CC2 of the second management module MM2 is unable to operate normally, the second control chip CC2 of the second management module MM2 is configured to output the second status signal STATUS2 having a second voltage level (such as low voltage level) via its second status output port #STA2.

When it is determined in step 242 that the first control chip CC1 of the first management module MM1 is able to receive the second heartbeat signal S_HB2 and it is then determined in step 244 that the second control chip CC2 of the second management module MM2 is able to receive the first heartbeat signal S_HB1, it indicates that both the first control chip CC1 of the first management module MM1 and the second control chip CC2 of the second management module MM2 are both able to operate normally. Under such circumstance, the immersion cooling systems 201 and 202 are configured to execute step 250 so that the first management module MM1 (the main management module) reads and outputs the data measured by the sensor 21 using the first control chip CC1 for controlling the immersion cooling process. Next, the present method loops back to step 220 for continuing to real-time monitor the status of the first control chip CC1 of the first management module MM1 and the second control chip CC2 of the second management module MM2.

When it is determined in step 242 that the first control chip CC1 of the first management module MM1 is unable to receive the second heartbeat signal S_HB2 and it is then determined in step 246 that the first control chip CC1 of the first management module MM1 is able to operate normally, it indicates that the first control chip CC1 of the first management module MM1 is able to operate normally but the second control chip CC2 of the second management module MM2 is unable to operate normally. Under such circumstance, the immersion cooling systems 201 and 202 are configured to execute step 260 so that the first management module MM1 (the main management module) reads and outputs the data measured by the sensor 21 using the first control chip CC1 for controlling the immersion cooling process. Meanwhile, the first control chip CC1 of the first management module MM1 is configured to send the first reset signal RST1 for resetting the second control chip CC2 of the second management module MM2. Next, the present method loops back to step 220 for continuing to real-time monitor the status of the first control chip CC1 of the first management module MM1 and the second control chip CC2 of the second management module MM2. If the second control chip CC2 of the second management module MM2 is able to transmit the second heartbeat signal S_HB2 after being reset by the first reset signal RST1, it can be determined during the subsequent execution of steps 242-248 that the second control chip CC2 of the second management module MM2 is able to operate normally for providing backup function when requested.

When it is determined in step 242 that the first control chip CC1 of the first management module MM1 is able to receive the second heartbeat signal S_HB2, but it is then determined in steps 244 and 248 that the second control chip CC2 of the second management module MM2 is unable to receive the first heartbeat signal S_HB1 and is able to operate normally, it indicates that the second control chip CC2 of the second management module MM2 is able to operate normally but the first control chip CC1 of the first management module MM1 is unable to operate normally. Under such circumstance, the immersion cooling systems 201 and 202 are configured to execute step 270 for activating backup function, so that the second management module MM2 (the backup management module) reads and outputs the data measured by the sensor 22 using the second control chip CC2 for controlling the immersion cooling process. Meanwhile, the second control chip CC2 of the second management module MM2 is configured to send the second reset signal RST2 for resetting the first control chip CC1 of the first management module MM1. Next, the present method loops back to step 220 for continuing to real-time monitor the status of the first control chip CC1 of the first management module MM1 and the second control chip CC2 of the second management module MM2. If the first control chip CC1 of the first management module MM1 is able to transmit the first heartbeat signal S_HB1 after being reset by the second reset signal RST2, it can be determined during the subsequent execution of steps 242-248 that the first control chip CC1 of the first management module MM1 is able to operate normally. Under such circumstance, the first management module MM1 reads and outputs the data measured by the sensor 21 using the first control chip CC1 again for controlling the immersion cooling process, while the second control chip CC2 of the second management module MM2 stops reading and outputting the data measured by the sensor 22 for deactivating the backup function.

In the embodiment depicted in FIGS. 3A and 3B, each of the immersion cooling systems 201 and 202 further includes a first storage device 41 and a second storage device 42. During the execution of step 250, 260 or 270, the first control chip CC1 of the first management module MM1 may be coupled to the sensor 21 via the first data sensing port SP1 for selectively receiving data measured by the sensor 21 and may output data to the first storage device 41 via the first data transmitting port SP1; the second control chip CC2 of the second management module MM2 may be coupled to the sensor 22 via the second data sensing port SP2 for selectively receiving data measured by the sensor 22 and may output data to the second storage device 42 via the second data transmitting port SP2. In an embodiment, each of the first storage device 41 and the second storage device 42 may be a flash memory, an SD memory card, an SDIO memory card, or an eMMC, an SAS hard drive or an NNMe hard drive, but not limited thereto. In an embodiment, each of the first storage device 41 and the second storage device 42 may adopt a RAID structure, but not limited thereto. In an embodiment, each of the first storage device 41 and the second storage device 42 may store and name each piece of data according to data receiving time, or store each piece of data as a metastable, but not limited thereto.

When it is determined in step 242 that the first control chip CC1 of the first management module MM1 is able to receive the second heartbeat signal S_HB2, but it is then determined in steps 244 and 248 that the second control chip CC2 of the second management module MM2 is unable to receive the first heartbeat signal S_HB1 and is unable to operate normally, it indicates that the first control chip CC1 of the first management module MM1 and the second control chip CC2 of the second management module MM2 are both unable to operate normally. When it is determined in step 242 that the first control chip CC1 of the first management module MM1 is unable to receive the second heartbeat signal S_HB2 and then in step 246 that the first control chip CC1 of the first management module MM1 is unable to operate normally, it indicates that both the first control chip CC1 of the first management module MM1 and the second control chip CC2 of the second management module MM2 are unable to operate normally. In the above-mentioned two cases, the immersion cooling systems 201 and 202 are configured to execute step 280 for sending an alarm signal, thereby informing that the first control chip CC1 of the first management module MM1 and/or the second control chip CC2 of the second management module MM2 has failed.

In the embodiment depicted in FIG. 3A, the immersion cooling system 201 further includes a first alarm device LED1 and a second alarm device LED2. The first alarm device LED1 is coupled to the first status output port #STA1 in the first control chip CC1 of the first management module MM1 and configured to selectively send a first alarm signal based on the first status signal STATUS1. The second alarm device LED2 is coupled to the second status output port #STA2 in the second control chip CC2 of the second management module MM2 and configured to selectively send a second alarm signal based on the second status signal STATUS2. More specifically, when determining that the first control chip CC1 of the first management module MM1 is unable to operate normally based on the first status signal STATUS1 (such as when the first status signal STATUS1 is at the second voltage level), the first alarm device LED1 is configured to send the first alarm signal; when determining that the second control chip CC2 of the second management module MM2 is unable to operate normally based on the second status signal STATUS2 (such as when the second status signal STATUS2 is at the second voltage level), the second alarm device LED2 is configured to send the second alarm signal.

In the embodiment depicted in FIG. 3B, the immersion cooling system 202 further includes an alarm device LED and a logic circuit 50. The logic circuit 50, coupled to the first status output port #STA1 in the first control chip CC1 of the first management module MM1 and the second status output port #STA2 in the second control chip CC2 of the second management module MM2, is configured to output a logic signal LOGIC based on the first status signal STATUS1 and the second status signal STATUS2. The alarm device LED is coupled to the logic circuit 50 and configured to selectively send an alarm signal based on the logic signal LOGIC. More specifically, when determining that the first control chip CC1 of the first management module MM1 and the second control chip CC2 of the second management module MM2 are both unable to operate normally based on the first status signal STATUS1 and the second status signal STATUS2 (such as when the first status signal STATUS1 and the second status signal STATUS2 are both at the second voltage level), the logic circuit 50 is configure to output the logic signal LOGIC having a third voltage level (such as high voltage level), thereby instructing the alarm device LED to send the alarm signal; when determining that at least one of the first control chip CC1 of the first management module MM1 and the second control chip CC2 of the second management module MM2 is able to operate normally based on the first status signal STATUS1 and the second status signal STATUS2 (such as when at least one of the first status signal STATUS1 and the second status signal STATUS2 is at the first voltage level), the logic circuit 50 is configure to output the logic signal LOGIC having a fourth voltage level (such as low voltage level), thereby instructing the alarm device LED not to send the alarm signal.

It is noteworthy that the immersion cooling system 201 depicted in FIG. 3A may also adopt the alarm scheme using individual alarm devices as depicted in FIG. 3B, and that the immersion cooling system 202 depicted in FIG. 3B may also adopt the alarm scheme using a single alarm device as depicted in FIG. 3A. In an embodiment, the alarm devices LED, LED1 and LED2 may be light-emitting diodes, but not limited thereto. In another embodiment, the alarm devices LED, LED1 and LED2 may be audio alarm device. However, the type of the alarm device does not limit scope of the present invention.

Figure 5A:
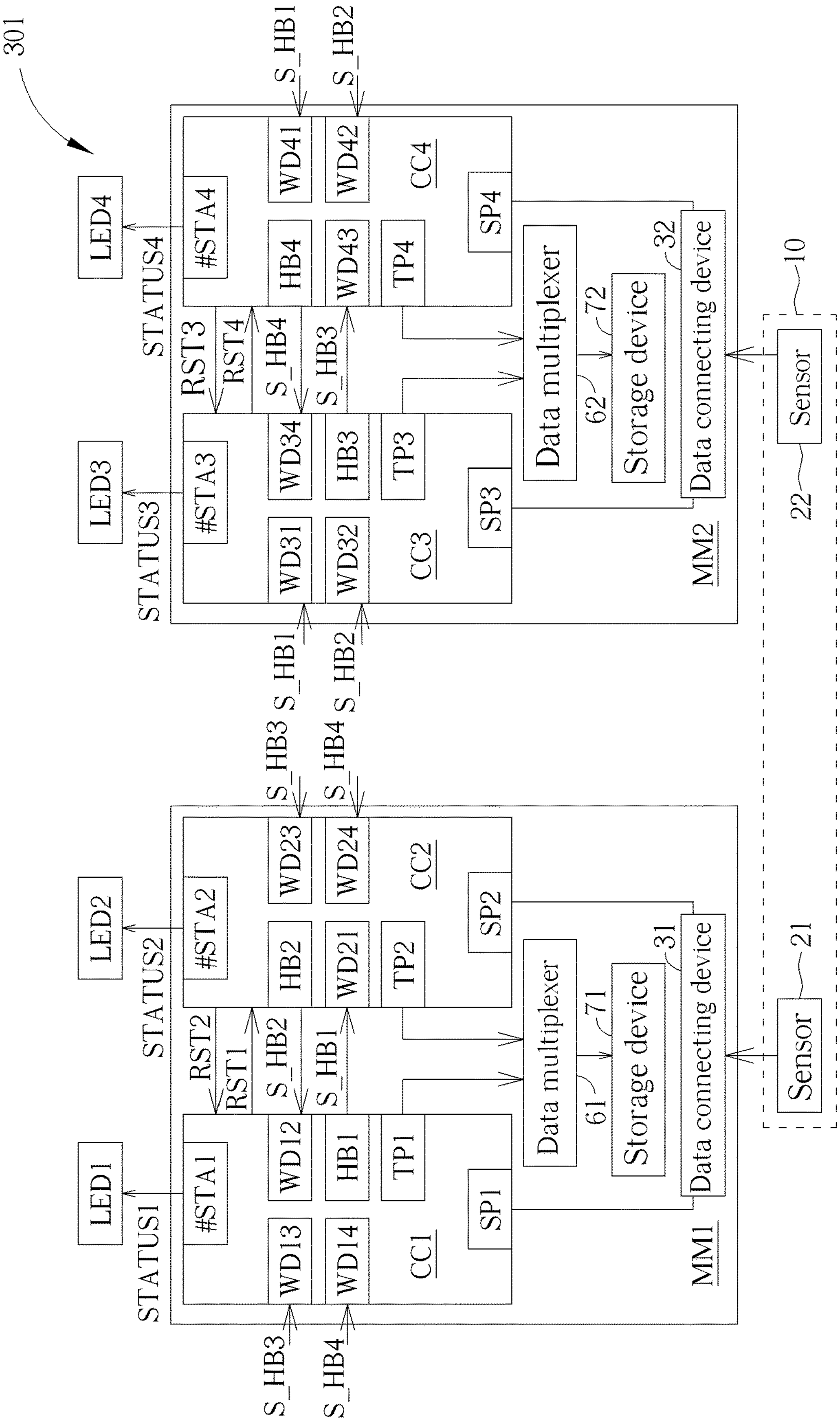
FIG. 5A is a diagram illustrating an immersion cooling system according to an embodiments of the present application.
Figure 5B:
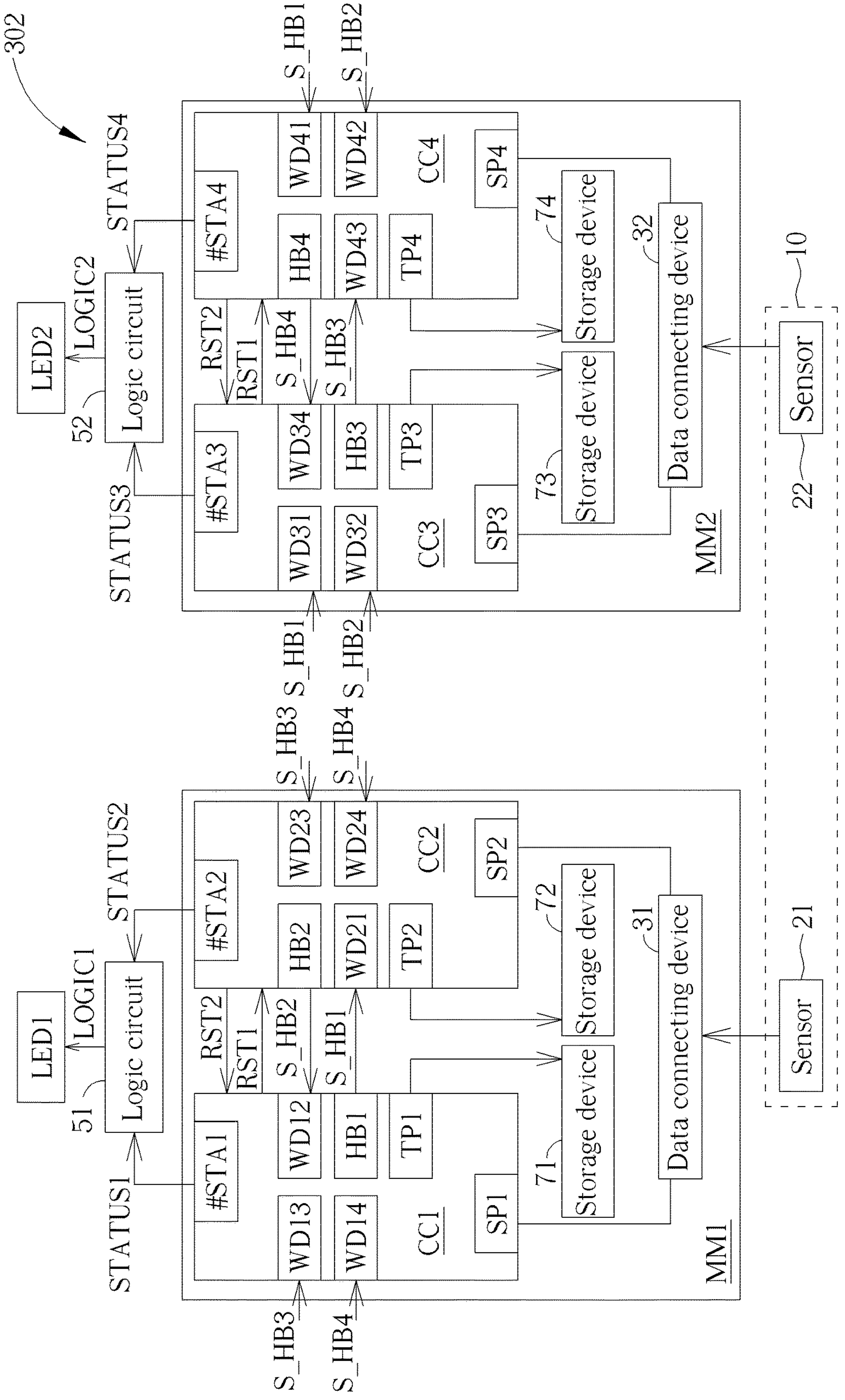
FIG. 5B is a diagram illustrating an immersion cooling system according to another embodiments of the present application.
Figure 5C:
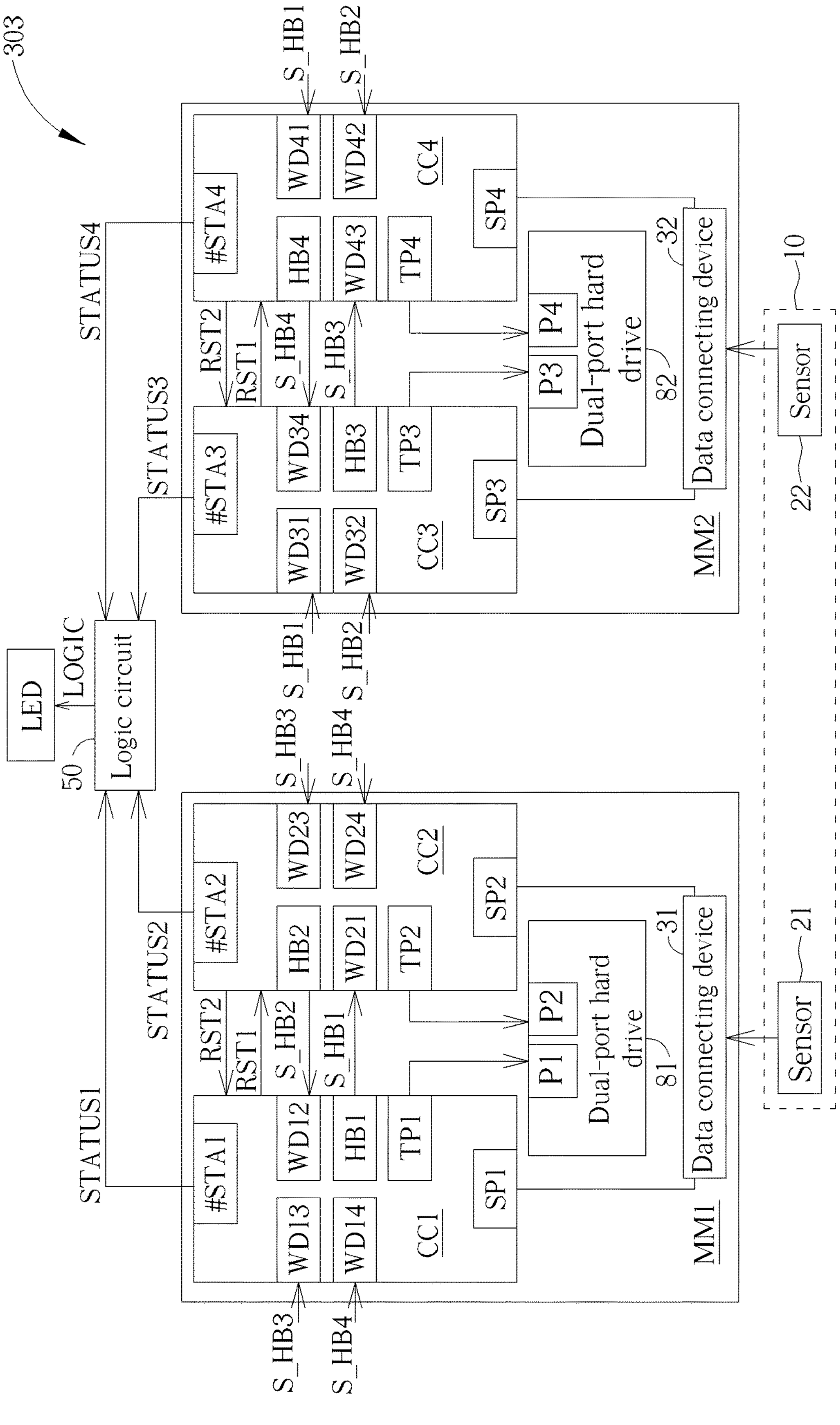
FIG. 5C is a diagram illustrating an immersion cooling system according to another embodiments of the present application.

FIGS. 5A-5C are diagrams illustrating immersion cooling systems 301-303 according to embodiments of the present application. Each of the immersion cooling systems 301-303 includes a cooling tank 10, a plurality of sensors, and M management modules each including N control chip, wherein M and N are integers larger than 1. The immersion cooling systems 301-303 can provide backup scheme and failure alarm function in M×N mode. For illustrative purposes, it is assumed that each of the immersion cooling systems 301-303 includes at least two sensors 21 and 22, and at least two management modules each having two control chips. The first management module MM1 functions as the main management module of the immersion cooling systems 301-303 and includes a first control chip CC1 and a second control chip CC2. The first control chip CC1 is the main control chip of the first management module MM1 and includes a first heartbeat circuit HB1, watchdog circuits WD12-WD14, a first data sensing port SP1, a first data transmitting port TP1 and a first status output port #STA1. The second control chip CC2 is the backup control chip of the first management module MM1 and includes a second heartbeat circuit HB2, watchdog circuits WD21, WD23 and WD24, a second data sensing port SP2, a second data transmitting port TP2 and a second status output port #STA2.

The second management module MM2 functions as the backup management module of the immersion cooling systems 301-303 and includes a third control chip CC3 and a fourth control chip CC4. The third control chip CC3 is the main control chip of the second management module MM2 and includes a third heartbeat circuit HB3, watchdog circuits WD31, WD32 and WD34, a third data sensing port SP3, a third data transmitting port TP3 and a third status output port #STA3. The fourth control chip CC4 is the backup control chip of the second management module MM2 and includes a fourth heartbeat circuit HB4, watchdog circuits WD41-WD43, a fourth data sensing port SP4, a fourth data transmitting port TP4 and a fourth status output port #STA4.

The immersion cooling systems 301-303 of the present invention can provide backup scheme and failure alarm function in 2×2 mode: when determining that all devices in the first management module MM1 are able to operate normally, the first management module MM1 (the main management module) is configured to control the immersion cooling process using the first control chip CC1 (the main control chip); when determining that the first chip CC1 of the first management module MM1 is unable to operate normally but the second chip CC2 of the first management module MM1 is able to operate normally, the first management module MM1 (the main management module) is configured to control the immersion cooling process using the second control chip CC2 (the backup control chip); when determining that all control chips of the first management module MM1 are unable to operate normally, the second management module MM2 is configured to provide backup function.

With the backup function of the second management module MM2 activated, when determining that all devices in the second management module MM2 are able to operate normally, the second management module MM2 (the backup management module) is configured to control the immersion cooling process using the third control chip CC3 (the main control chip); when determining that the third chip CC3 of the second management module MM2 is unable to operate normally but the fourth chip CC4 of the second management module MM2 is able to operate normally, the second management module MM2 (the backup management module) is configured to control the immersion cooling process using the fourth control chip CC4 (the backup control chip); when determining that the first management module MM1 and/or the second management module MM2 cannot operate normally, the immersion cooling systems 301-303 are configured to send an alarm signal.

Figure 6A:
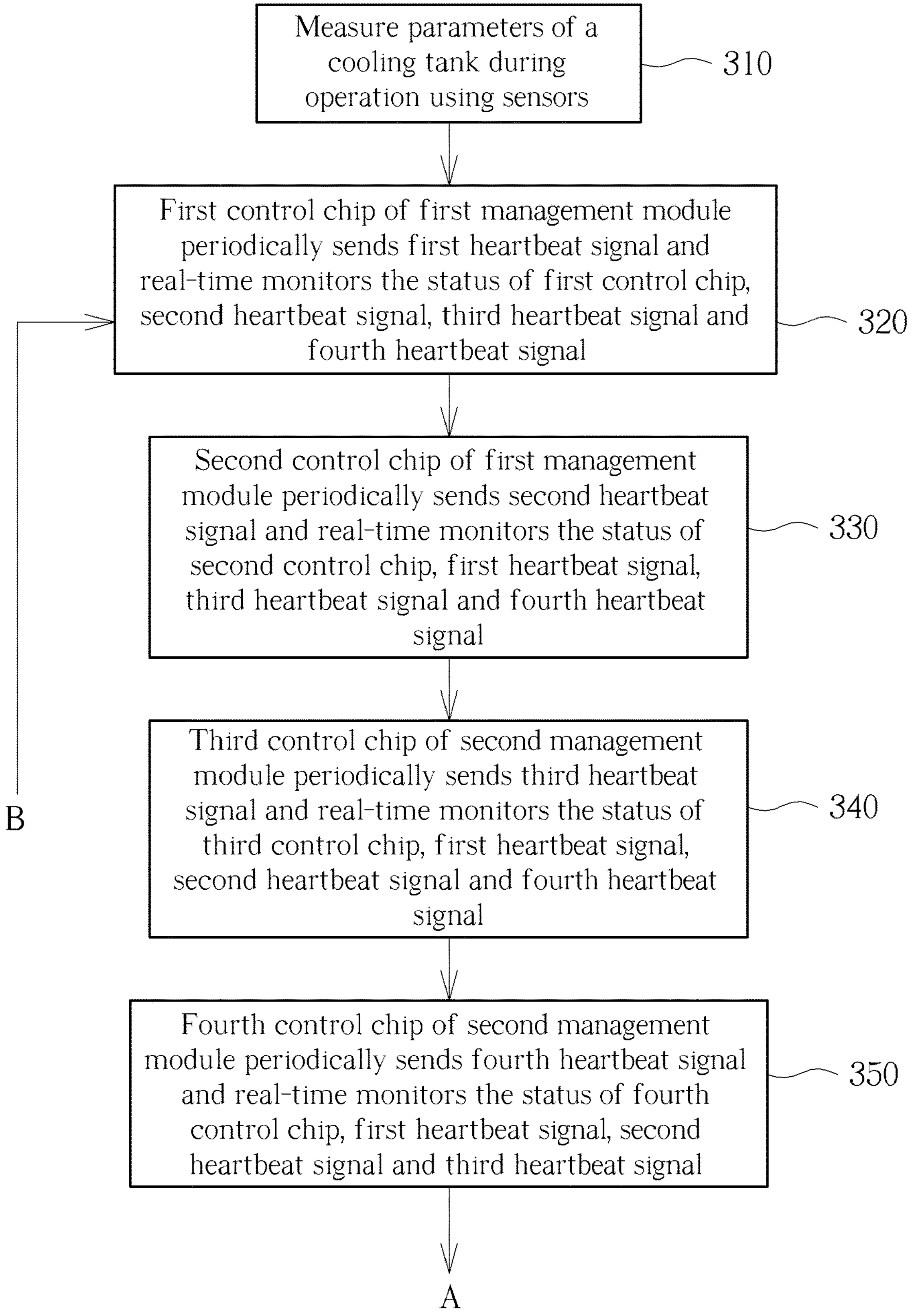
FIGS. 6A-6C depict a flowchart illustrating the operation of an immersion cooling system according to embodiments of the present application.
Figure 6B:
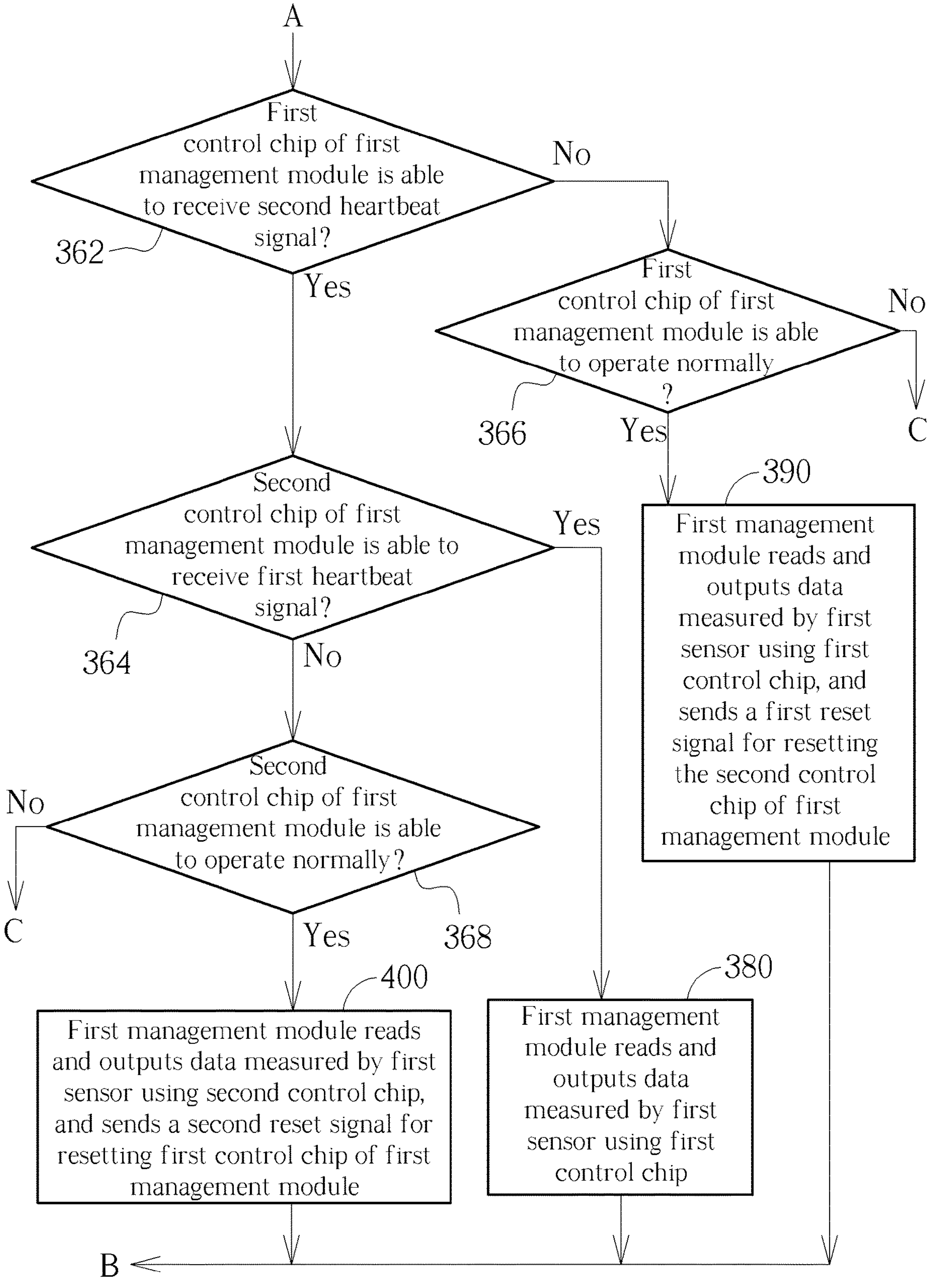
Figure 6C:
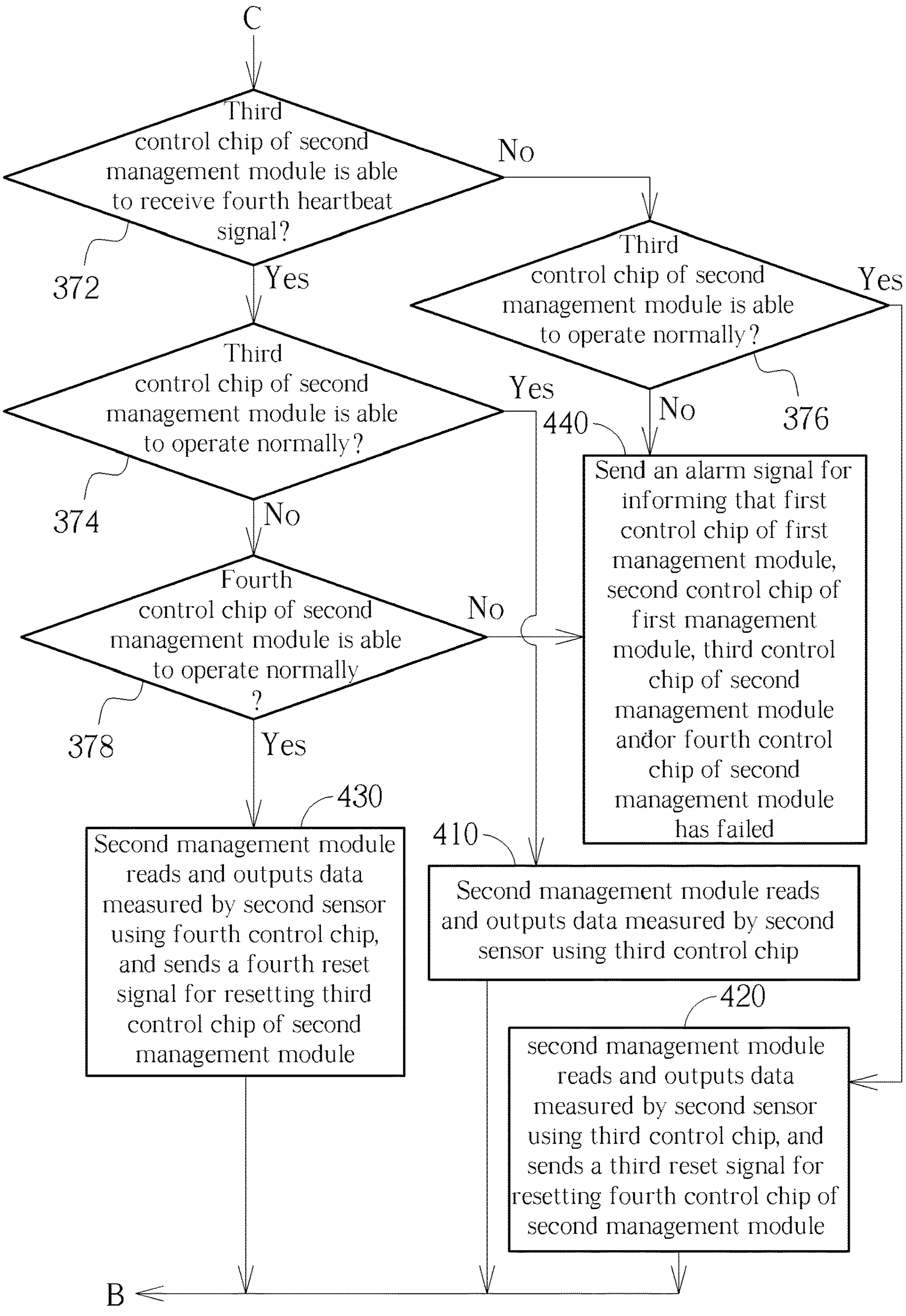

FIGS. 6A and 6B depict a flowchart illustrating the operation of the immersion cooling systems 301-303 according to embodiments of the present application. The flowchart depicted in FIGS. 6A and 6B includes the following steps:

Step 310: dispose the sensors 21 and 22 in the cooling tank 10 for measuring parameters of the cooling tank 10 during operation.

Step 320: the first control chip CC1 of the first management module MM1 periodically sends a first heartbeat signal S_HB1 and real-time monitors the status of the first control chip CC1, a second heartbeat signal S_HB2, a third heartbeat signal S_HB3 and a fourth heartbeat signal S_HB4.

Step 330: the second control chip CC2 of the first management module MM1 periodically sends the second heartbeat signal S_HB2 and real-time monitors the status of the second control chip CC2, the first heartbeat signal S_HB1, the third heartbeat signal S_HB3 and the fourth heartbeat signal S_HB4.

Step 340: the third control chip CC3 of the second management module MM2 periodically sends the third heartbeat signal S_HB3 and real-time monitors the status of the third control chip CC3, the first heartbeat signal S_HB1, the second heartbeat signal S_HB3 and the fourth heartbeat signal S_HB4.

Step 350: the fourth control chip CC4 of the second management module MM2 periodically sends the fourth heartbeat signal S_HB4 and real-time monitors the status of the fourth control chip CC4, the first heartbeat signal S_HB1, the second heartbeat signal S_HB3 and the third heartbeat signal S_HB4.

Step 362: determine whether the first control chip CC1 of the first management module MM1 is able to receive the second heartbeat signal S_HB2; if yes, execute step 364; if no, execute step 366.

Step 364: determine whether the second control chip CC2 of the first management module MM1 is able to receive the first heartbeat signal S_HB1; if yes, execute step 380; if no, execute step 368.

Step 366: determine whether the first control chip CC1 of the first management module MM1 is able to operate normally; if yes, execute step 390; if no, execute step 372.

Step 368: determine whether the second control chip CC2 of the first management module MM1 is able to operate normally; if yes, execute step 400; if no, execute step 372.

Step 372: determine whether the third control chip CC3 of the second management module MM2 is able to receive the fourth heartbeat signal S_HB4; if yes, execute step 374; if no, execute step 376.

Step 374: determine whether the fourth control chip CC4 of the second management module MM2 is able to receive the third heartbeat signal S_HB3; if yes, execute step 410; if no, execute step 378.

Step 376: determine whether the third control chip CC3 of the second management module MM2 is able to operate normally; if yes, execute step 420; if no, execute step 440.

Step 378: determine whether the fourth control chip CC4 of the second management module MM2 is able to operate normally; if yes, execute step 430; if no, execute step 440.

Step 380: the first management module MM1 reads and outputs the data measured by the sensor 21 using the first control chip CC1; execute step 320.

Step 390: the first management module MM1 reads and outputs the data measured by the sensor 21 using the first control chip CC1, and sends a first reset signal RST1 for resetting the second control chip CC2 of the first management module MM1; execute step 320.

Step 400: the first management module MM1 reads and outputs the data measured by the sensor 21 using the second control chip CC2, and sends a second reset signal RST2 for resetting the first control chip CC1 of the first management module MM1; execute step 320.

Step 410: the second management module MM2 reads and outputs the data measured by the sensor 22 using the third control chip CC3; execute step 320.

Step 420: the second management module MM2 reads and outputs the data measured by the sensor 22 using the third control chip CC3, and sends a third reset signal RST3 for resetting the fourth control chip CC4 of the second management module MM2; execute step 320.

Step 430: the second management module MM2 reads and outputs the data measured by the sensor 22 using the fourth control chip CC4, and sends a fourth reset signal RST4 for resetting the third control chip CC3 of the second management module MM2; execute step 320.

Step 440: send an alarm signal for informing that the first control chip CC1 of the first management module MM1, the second control chip CC2 of the first management module MM1, the third control chip CC3 of the second management module MM2 and/or the fourth control chip CC4 of the second management module MM2 has failed.

In step 310, at least two sensors 21 ad 22 are disposed in the cooling tank 10 of the immersion cooling systems 301-303 for measuring the parameters of the cooling tank 10 during operation. For example, the sensors 21 ad 22 may be disposed at different locations in the cooling tank 10 for measuring the temperatures of the cooling tank 10 at different locations.

In the first management module MM1 of the immersion cooling systems 301-303 according to embodiments of the present invention, the watchdog circuits WD12, WD13 and WD14 in the first control chip CC1 are respectively coupled to the second heartbeat circuit HB2 in the second control circuit CC2, the third heartbeat circuit HB3 in the third control circuit CC3, and the fourth heartbeat circuit HB4 in the fourth control circuit CC4; the watchdog circuits WD21, WD23 and WD24 in the second control chip CC2 are respectively coupled to the first heartbeat circuit HB1 in the first control circuit CC2, the third heartbeat circuit HB3 in the third control circuit CC3, and the fourth heartbeat circuit HB4 in the fourth control circuit CC4.

In the second management module MM2 of the immersion cooling systems 301-303 according to embodiments of the present invention, the watchdog circuits WD31, WD32 and WD34 in the third control chip CC3 are respectively coupled to the first heartbeat circuit HB1 in the first control circuit CC1, the second heartbeat circuit HB2 in the second control circuit CC2, and the fourth heartbeat circuit HB4 in the fourth control circuit CC4; the watchdog circuits WD41, WD42 and WD43 in the fourth control chip CC4 are respectively coupled to the first heartbeat circuit HB1 in the first control circuit CC2, the second heartbeat circuit HB2 in the second control circuit CC4, and the third heartbeat circuit HB3 in the third control circuit CC3.

In step 320, the first control chip CC1 of the first management module MM1 is configured to periodically send the first heartbeat signal S_HB1 and real-time monitor the status of the first control chip CC1 and the second heartbeat signal S_HB2, the third heartbeat signal S_HB3 and the fourth heartbeat signal S_HB4. In step 330, the second control chip CC1 of the first management module MM1 is configured to periodically send the second heartbeat signal S_HB2 and real-time monitor the status of the second control chip CC2, the first heartbeat signal S_HB1, the third heartbeat signal S_HB3 and the fourth heartbeat signal S_HB4. In step 340, the third control chip CC3 of the second management module MM2 is configured to periodically send the third heartbeat signal S_HB3 and real-time monitor the status of the third control chip CC3, the first heartbeat signal S_HB1, the second heartbeat signal S_HB2 and the fourth heartbeat signal S_HB4. In step 350, the fourth control chip CC4 of the second management module MM2 is configured to periodically send the fourth heartbeat signal S_HB4 and real-time monitor the status of the fourth control chip C4, the first heartbeat signal S_HB1, the second heartbeat signal S_HB2 and the third heartbeat signal S_HB3.

In an embodiment, the first control chip CC1 of the first management module MM1 is configured to monitor its first heartbeat signal S_HB1 and monitor the second heartbeat signal S_HB2 via the watchdog circuit WD12 on a real-time basis, thereby real-time monitoring its own status and the status of the second control chip CC2 of the first management module MM1; the second control chip CC2 of the first management module MM1 is configured to monitor its second heartbeat signal S_HB2 and monitor the first heartbeat signal S_HB1 via the watchdog circuit WD21 on a real-time basis, thereby real-time monitoring its own status and the status of the first control chip CC1 of the first management module MM1; the third control chip CC3 of the second management module MM2 is configured to monitor its third heartbeat signal S_HB3 and monitor the fourth heartbeat signal S_HB4 via the watchdog circuit WD34 on a real-time basis, thereby real-time monitoring its own status and the status of the fourth control chip CC4 of the second management module MM2; the fourth control chip CC4 of the second management module MM2 is configured to monitor its third heartbeat signal S_HB4 and monitor the third heartbeat signal S_HB3 via the watchdog circuit WD43 on a real-time basis, thereby real-time monitoring its own status and the status of the third control chip CC3 of the second management module MM2. In another embodiment, each of the first control chip CC1 and the second control chip CC2 of the first management module MM1 is configured to real-time monitor its own status using software, and each of the third control chip CC3 and the fourth control chip CC4 of the second management module MM2 is configured to real-time monitor its own status using software. However, the method adopted by the first management module MM1 or the second management module MM2 to real-time monitor its own status does not limit the scope of the present invention.

In step 362, it is determined whether the first control chip CC1 of the first management module MM1 is able to receive the second heartbeat signal S_HB2. In step 364, it is determined whether the second control chip CC2 of the first management module MM1 is able to receive the first heartbeat signal S_HB1. In step 366, it is determined whether the first control chip CC1 of the first management module MM1 is able operate normally. In step 368, it is determined whether the second control chip CC2 of the first management module MM1 is able to operate normally. In step 372, it is determined whether the third control chip CC3 of the second management module MM2 is able to receive the fourth heartbeat signal S_HB4. In step 374, it is determined whether the fourth control chip CC4 of the second management module MM2 is able receive the third heartbeat signal S_HB3. In step 376, it is determined whether the third control chip CC3 of the second management module MM2 is able operate normally. In step 378, it is determined whether the fourth control chip CC4 of the second management module MM2 is able operate normally.

In an embodiment, when it is determined that the first control chip CC1 or the second control chip CC2 of the first management module MM1 is able to operate normally, the first control chip CC1 of the first management module MM1 is configured to output the first status signal STATUS1 having a first voltage level (such as high voltage level) via its first status output port #STA1, or the second control chip CC2 of the first management module MM1 is configured to output the second status signal STATUS2 having a first voltage level (such as high voltage level) via its second status output port #STA2; when it is determined that the first control chip CC1 or the second control chip CC1 of the first management module MM1 is unable to operate normally, the first control chip CC1 of the first management module MM1 is configured to output the first status signal STATUS1 having a second voltage level (such as low voltage level) via its first status output port #STA1, or the second control chip CC2 of the first management module MM1 is configured to output the second status signal STATUS2 having a second voltage level (such as low voltage level) via its second status output port #STA2. Similarly, when it is determined that the third control chip CC3 or the fourth control chip CC4 of the second management module MM2 is able to operate normally, the third control chip CC3 of the second management module MM2 is configured to output the third status signal STATUS3 having a first voltage level (such as high voltage level) via its third status output port #STA3, or the fourth control chip CC4 of the second management module MM2 is configured to output the fourth status signal STATUS4 having a first voltage level (such as high voltage level) via its fourth status output port #STA4; when it is determined that the third control chip CC3 or the fourth control chip CC4 of the second management module MM2 is unable to operate normally, the third control chip CC3 of the second management module MM2 is configured to output the third status signal STATUS3 having a second voltage level (such as low voltage level) via its third status output port #STA3, or the fourth control chip CC4 of the second management module MM2 is configured to output the fourth status signal STATUS4 having a second voltage level (such as low voltage level) via its fourth status output port #STA4.

When it is determined in step 362 that the first control chip CC1 of the first management module MM1 is able to receive the second heartbeat signal S_HB2 and it is then determined in step 364 that the second control chip CC2 of the first management module MM1 is able to receive the first heartbeat signal S_HB1, it indicates that the first control chip CC1 and the second control chip CC2 of the first management module MM1 are both able to operate normally. Under such circumstance, the immersion cooling systems 301-303 are configured to execute step 380 so that the first management module MM1 (the main management module) reads and outputs the data measured by the sensor 21 using the first control chip CC1 (the main control chip) for controlling the immersion cooling process. Next, the present method loops back to step 320 for continuing to real-time monitor the status of all control chips in the first management module MM1 and the second management module MM2.

When it is determined in step 362 that the first control chip CC1 of the first management module MM1 is unable to receive the second heartbeat signal S_HB2 and it is then determined in step 366 that the first control chip CC1 of the first management module MM1 is able to operate normally, it indicates that the first control chip CC1 of the first management module MM1 is able to operate normally but the second control chip CC2 of the first management module MM1 is unable to operate normally. Under such circumstance, the immersion cooling systems 301-303 are configured to execute step 390 so that the first management module MM1 (the main management module) reads and outputs the data measured by the sensor 21 using the first control chip CC1 (the main control chip) for controlling the immersion cooling process. Meanwhile, the first control chip CC1 of the first management module MM1 is configured to send the first reset signal RST1 for resetting the second control chip CC2 (the backup control chip) of the first management module MM1. Next, the present method loops back to step 320 for continuing to real-time monitor the status of all control chips of the first management module MM1 and the second management module MM2. If the second control chip CC2 of the first management module MM1 is able to transmit the second heartbeat signal S_HB2 after being reset by the first reset signal RST1, it can be determined during the subsequent execution of steps 362-368 that the second control chip CC2 of the first management module MM1 is able to operate normally for providing backup function when requested.

When it is determined in step 362 that the first control chip CC1 of the first management module MM1 is able to receive the second heartbeat signal S_HB2, but it is then determined in steps 364 and 368 that the second control chip CC2 of the first management module MM1 is unable to receive the first heartbeat signal S_HB1 and is able to operate normally, it indicates that the second control chip CC2 of the first management module MM1 is able to operate normally but the first control chip CC1 of the first management module MM1 is unable to operate normally. Under such circumstance, the immersion cooling systems 301-303 are configured to execute step 400 for activating backup function, so that the first management module MM1 (the main management module) reads and outputs the data measured by the sensor 21 using the second control chip CC2 (the backup control chip) for controlling the immersion cooling process. Meanwhile, the second control chip CC2 of the first management module MM1 is configured to send the second reset signal RST2 for resetting the first control chip CC1 of the first management module MM1. Next, the present method loops back to step 320 for continuing to real-time monitor the status of all control chips of the first management module MM1 and the second management module MM2. If the first control chip CC1 of the first management module MM1 is able to transmit the first heartbeat signal S_HB1 after being reset by the second reset signal RST2, it can be determined during the subsequent execution of steps 362-368 that the first control chip CC1 of the first management module MM1 is able to operate normally. Under such circumstance, the first management module MM1 reads and outputs the data measured by the sensor 21 using the first control chip CC1 again for controlling the immersion cooling process, while the second control chip CC2 of the first management module MM1 stops reading and outputting the data measured by the sensor 21 for deactivating the backup function.

When it is determined in step 362 that the first control chip CC1 of the first management module MM1 is able to receive the second heartbeat signal S_HB2, but it is then determined in steps 364 and 368 that the second control chip CC2 of the first management module MM1 is unable to receive the first heartbeat signal S_HB1 and is unable to operate normally, it indicates that both the first control chip CC1 and the second control chip CC2 of the first management module MM1 are unable to operate normally. When it is determined in step 362 that the first control chip CC1 of the first management module MM1 is unable to receive the second heartbeat signal S_HB2 and then in step 366 that the first control chip CC1 of the first management module MM1 is unable operate normally, it indicates that the first control chip CC1 and the second control chip CC2 of the first management module MM1 are both unable to operate normally. In the above-mentioned two cases, the immersion cooling systems 301-303 are configured to execute step 372 for determining the status of the second management module MM2.

When it is determined in step 372 that the third control chip CC3 of the second management module MM2 is able to receive the fourth heartbeat signal S_HB4 and it is then determined in step 374 that the fourth control chip CC4 of the second management module MM2 can receive the third heartbeat signal S_HB3, it indicates that the third control chip CC3 and the fourth control chip CC4 of the second management module MM2 are both able to operate normally. Under such circumstance, the immersion cooling systems 301-303 are configured to execute step 410 for activating the backup function, so that the second management module MM2 (the backup management module) reads and outputs the data measured by the sensor 22 using the third control chip CC3 (the main control chip) for controlling the immersion cooling process. Next, the present method loops back to step 320 for continuing to real-time monitor the status of all control chips in the first management module MM1 and the second management module MM2.

When it is determined in step 372 that the third control chip CC3 of the second management module MM2 is unable to receive the fourth heartbeat signal S_HB4 and it is then determined in step 376 that the third control chip CC3 of the second management module MM2 is able to operate normally, it indicates that the third control chip CC1 of the second management module MM2 is able to operate normally but the fourth control chip CC4 of the second management module MM2 is unable to operate normally. Under such circumstance, the immersion cooling systems 301-303 are configured to execute step 420 for activating the backup function, so that the second management module MM2 (the backup management module) reads and outputs the data measured by the sensor 22 using the third control chip CC3 (the main control chip) for controlling the immersion cooling process. Meanwhile, the third control chip CC3 of the second management module MM2 is configured to send the third reset signal RST3 for resetting the fourth control chip CC4 (the backup control chip) of the second management module MM2. Next, the present method loops back to step 320 for continuing to real-time monitor the status of all control chips in the first management module MM1 and the second management module MM2. If the fourth control chip CC4 of the second management module MM2 is able transmit the fourth heartbeat signal S_HB4 after being reset by the third reset signal RST3, it can be determined during the subsequent execution of steps 372-378 that the fourth control chip CC4 of the second management module MM2 is able to operate normally for providing backup function when requested.

When it is determined in step 372 that the third control chip CC3 of the second management module MM2 is able to receive the fourth heartbeat signal S_HB4, but it is then determined in steps 374 and 378 that the fourth control chip CC4 of the second management module MM2 is unable to receive the third heartbeat signal S_HB3 and is able to operate normally, it indicates that the fourth control chip CC4 of the second management module MM2 is able to operate normally but the third control chip CC3 of the second management module MM2 is unable to operate normally. Under such circumstance, the immersion cooling systems 301-303 are configured to execute step 430 for activating backup function, so that the second management module MM2 (the backup management module) reads and outputs the data measured by the sensor 22 using the fourth control chip CC4 (the backup control chip) for controlling the immersion cooling process. Meanwhile, the fourth control chip CC4 of the second management module MM2 is configured to send the fourth reset signal RST4 for resetting the third control chip CC3 of the first management module MM1. Next, the present method loops back to step 320 for continuing to real-time monitor the status of all control chips in the first management module MM1 and the second management module MM2. If the third control chip CC3 of the second management module MM2 is able to transmit the third heartbeat signal S_HB3 after being reset by the fourth reset signal RST4, it can be determined during the subsequent execution of steps 372-378 that the third control chip CC3 of the second management module MM2 is able to operate normally. Under such circumstance, the second management module MM2 reads and outputs the data measured by the sensor 22 using the third control chip CC3 again for controlling the immersion cooling process, while the fourth control chip CC4 of the second management module MM2 stops reading and outputting the data measured by the sensor 22 for deactivating the backup function.

When it is determined in step 372 that the third control chip CC3 of the second management module MM2 is able to receive the fourth heartbeat signal S_HB4, but it is then determined in steps 374 and 378 that the fourth control chip CC4 of the second management module MM2 is unable to receive the third heartbeat signal S_HB3 and is unable to operate normally, it indicates that the third control chip CC3 and the fourth control chip CC4 of the second management module MM2 are both unable to operate normally. When it is determined in step 372 that the third control chip CC3 of the second management module MM2 is unable to receive the fourth heartbeat signal S_HB4 and then in step 376 that the third control chip CC3 of the second management module MM2 is unable operate normally, it indicates that the third control chip CC3 and the fourth control chip CC4 of the second management module MM2 are both unable to operate normally. In the above-mentioned two cases, the immersion cooling systems 301-303 are configured to execute step 440 for sending an alarm signal, thereby informing that the first management module MM1 and/or the second management module MM2 has failed.

When the present immersion cooling systems 301-303 execute step 380, 390, 400, 410, 420 or 430, the first data sensing port SP1 in the first control chip CC1 of the first management module MM1 may be coupled to the sensor 21 via a data connecting device 31, thereby selectively reading and outputting the data measured by the sensor 21; the second data sensing port SP2 in the second control chip CC2 of the first management module MM1 may be coupled to the sensor 21 via the data connecting device 31, thereby selectively reading and outputting the data measured by the sensor 21; the third data sensing port SP3 in the third control chip CC3 of the second management module MM2 may be coupled to the sensor 22 via a data connecting device 32, thereby selectively reading and outputting the data measured by the sensor 22; the fourth data sensing port SP4 in the fourth control chip CC4 of the second management module MM2 may be coupled to the sensor 22 via the data connecting device 32, thereby selectively reading and outputting the data measured by the sensor 22. In an embodiment, the data connecting device 31 or 32 may be a multiplexer and a hub, but not limited thereto.

In the embodiment depicted in FIG. 5A, the immersion cooling system 301 further includes two data multiplexers 61-62 and two storage devices 71-72. The data multiplexer 61 is coupled to the first data transmitting port TP1 in the first control chip CC1 of the first management module MM1 and the second data transmitting port TP2 in the second control chip CC2 of the first management module MM1 for receiving data outputted by the first data transmitting port TP1 and the second data transmitting port TP2 and for selectively outputting data received from the first data transmitting port TP1 or the second data transmitting port TP2. The data multiplexer 62 is coupled to the third data transmitting port TP3 in the third control chip CC3 of the second management module MM2 and the fourth data transmitting port TP4 in the fourth control chip CC4 of the second management module MM2 for receiving data outputted by the third data transmitting port TP3 and the fourth data transmitting port TP4 and for selectively outputting data received from the third data transmitting port TP3 or the fourth data transmitting port TP4. The storage device 71 is coupled to the data multiplexer 61 for receiving and storing data outputted by the data multiplexer 61. The storage device 72 is coupled to the data multiplexer 62 for receiving and storing data outputted by the data multiplexer 62. In an embodiment, the data multiplexer 61 or 62 may be a USB multiplexer, and the storage device 71 or 72 may be a flash memory, but not limited thereto. In an embodiment, the storage device 71 or 72 may store and name each piece of data according to data receiving time, or store each piece of data as a metastable, but not limited thereto.

In the embodiment depicted in FIG. 5B, the immersion cooling system 302 further includes storage devices 71-74. The storage device 71 is coupled to the first data transmitting port TP1 in the first control chip CC1 of the first management module MM1 for receiving and storing data outputted by the first data transmitting port TP1. The storage device 72 is coupled to the second data transmitting port TP2 in the second control chip CC2 of the first management module MM1 for receiving and storing data outputted by the second data transmitting port TP2. The storage device 73 is coupled to the third data transmitting port TP3 in the third control chip CC3 of the second management module MM2 for receiving and storing data outputted by the third data transmitting port TP3. The storage device 74 is coupled to the fourth data transmitting port TP4 in the fourth control chip CC4 of the second management module MM2 for receiving and storing data outputted by the fourth data transmitting port TP4. In an embodiment, each of the storage devices 71-74 may be an SD memory card, an SDIO memory card, or an eMMC, but not limited thereto. In an embodiment, each of the storage devices 71-74 may adopt a RAID structure, but not limited thereto. In an embodiment, each of the storage devices 71-74 may store and name each piece of data according to data receiving time, or store each piece of data as a metastable, but not limited thereto.

In the embodiment depicted in FIG. 5C, the immersion cooling system 303 further includes a dual-port hard drive 81 having a first data port P1 and a second data port P2 and a dual-port hard drive 82 having a third data port P3 and a fourth data port P4. The first data port P1 is coupled to the first data transmitting port TP1 in the first control chip CC1 of the first management module MM1 and the second data port P2 is coupled to the second data transmitting port TP2 in the second control chip CC2 of the first management module MM1 for receiving and storing data outputted by the first data transmitting port TP1 and the second data transmitting port TP2. The third data port P3 is coupled to the third data transmitting port TP3 in the third control chip CC3 of the second management module MM2 and the fourth data port P4 is coupled to the fourth data transmitting port TP4 in the fourth control chip CC4 of the second management module MM2 for receiving and storing data outputted by the third data transmitting port TP3 and the fourth data transmitting port TP4. In an embodiment, the dual-port hard drive 81 or 82 may be an SAS hard drive or an NVMe hard drive, but not limited thereto. In an embodiment, the dual-port hard drive 81 or 82 may adopt a RAID structure, but not limited thereto. In an embodiment, the dual-port hard drive 81 or 82 may store and name each piece of data according to data receiving time, or store each piece of data as a metastable, but not limited thereto.

In the embodiment depicted in FIG. 5A, the immersion cooling system 301 further includes alarm devices LED1-LED4. The first alarm device LED1 is coupled to the first status output port #STA1 in the first control chip CC1 of the first management module MM1 and configured to selectively send a first alarm signal based on the first status signal STATUS1. The second alarm device LED2 is coupled to the second status output port #STA2 in the second control chip CC2 of the first management module MM1 and configured to selectively send a second alarm signal based on the second status signal STATUS2. The third alarm device LED3 is coupled to the third status output port #STA3 in the third control chip CC3 of the second management module MM2 and configured to selectively send a third alarm signal based on the third status signal STATUS3. The fourth alarm device LED4 is coupled to the fourth status output port #STA4 in the fourth control chip CC4 of the second management module MM2 and configured to selectively send a fourth alarm signal based on the fourth status signal STATUS4. As previously described for the alarm scheme using individual alarm devices shown in FIG. 1A, the first alarm signal may inform that the first control chip CC1 in the first management module MM1 has failed, the second alarm signal may inform that the second control chip CC2 in the first management module MM1 has failed, the third alarm signal may inform that the third control chip CC3 in the second management module MM2 has failed, and the fourth alarm signal may inform that the fourth control chip CC4 in the second management module MM2 has failed.

In the embodiment depicted in FIG. 5B, the immersion cooling system 302 further includes a first alarm device LED1, a second alarm device LED2 and two logic circuits 51-52. The logic circuit 51, coupled to the first status output port #STA1 in the first control chip CC1 of the first management module MM1 and the second status output port #STA2 in the second control chip CC2 of the first management module MM1, is configured to output a logic signal LOGIC1 base on the first status signal STATUS1 and the second status signal STATUS2. The logic circuit 52, coupled to the third status output port #STA3 in the third control chip CC3 of the second management module MM2 and the fourth status output port #STA4 in the fourth control chip CC4 of the second management module MM2, is configured to output a logic signal LOGIC2 base on the third status signal STATUS3 and the fourth status signal STATUS4. The first alarm device LED1 is coupled to the logic circuit 51 and configured to selectively send a first alarm signal based on the logic signal LOGIC1. The second alarm device LED2 is coupled to the logic circuit 52 and configured to selectively send a second alarm signal based on the logic signal LOGIC2. As previously described for the alarm scheme using individual alarm devices shown in FIG. 1A, the first alarm signal may inform that at least one control chip in the first management module MM1 has failed, and the second alarm signal may inform that at least one control chip in the second management module MM2 has failed.

In the embodiment depicted in FIG. 5C, the immersion cooling system 303 further includes an alarm device LED and a logic circuit 50. The logic circuit 50 is coupled to the first status output port #STA1 in the first control chip CC1 of the first management module MM1, the second status output port #STA2 in the second control chip CC2 of the first management module MM1, the third status output port #STA3 in the third control chip CC3 of the second management module MM2 and the fourth status output port #STA4 in the fourth control chip CC4 of the second management module MM2. The logic circuit 50 is configured to output a logic signal LOGIC1 base on the first through the fourth status signals STATUS1-STATUS4. The alarm device LED is coupled to the logic circuit 50 and configured to selectively send an alarm signal based on the logic signal LOGIC. As previously described for the alarm scheme using single alarm device shown in FIG. 1B, the alarm signal may inform that at least one control chip in the first management module MM1 and the second management module MM2 has failed.

It is noteworthy that the immersion cooling system 301 depicted in FIG. 5A may also adopt the alarm scheme depicted in FIG. 5B or 5C, that the immersion cooling system 302 depicted in FIG. 5B may also adopt the alarm scheme depicted in FIG. 5A or 5C, and that the immersion cooling system 303 depicted in FIG. 5C may also adopt the alarm scheme depicted in FIG. 5A or 5B. In an embodiment, the alarm devices LED and LED1-LED4 may be light-emitting diodes, but not limited thereto. In another embodiment, the alarm devices LED and LED1-LED4 may be audio alarm device. However, the type of the alarm devices does not limit scope of the present invention.

In the immersion cooling systems 101-103, 201-202 and 303-303 according to embodiments of the present invention, each control chip may be a board management controller (BMC), a field programmable gate array (FPGA), a micro-controller unit (MCU) or an application specific integrated circuit (ASIC). However, the type of each control chip does not limit the scope of the present invention.

In the immersion cooling systems 101-103, 201-202 and 303-303 according to embodiments of the present invention, each data sensing port and each data transmitting port may be control chip may be an inter-integrated circuit (I2C) port, a serial peripheral interface bus (SPI) port, a serial port or an Ethernet port. However, the type of each data sensing port or each data transmitting port does not limit the scope of the present invention.

In conclusion, the present invention provides immersion cooling systems with flexible backup schemes. The user may select a specific backup mode according to application field, such as multi control chip backup within the same management module, multi management module backup, or multi control chip backup and multi management module backup. Also, each control chip is configured to real-time monitor its own status and the status of other control chips so as to send an alarm signal when detecting a failure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An immersion cooling system, comprising:
- a cooling tank;
- a first sensor disposed in the cooling tank and configured to measure a parameter of the cooling tank during operation;
- a first management module, comprising:
  - a first control chip, comprising:
    - a first heartbeat circuit configured to periodically send a first heartbeat signal;
    - a first watchdog circuit configured to real-time monitor a status of the first control chip and a second heartbeat signal;
    - a first data sensing port configured to selectively read data measured by the first sensor; and
    - a first data transmitting port configured to selectively output data read by the first data sensing port; and
  - a second control chip, comprising:
    - a second heartbeat circuit configured to periodically send the second heartbeat signal;
    - a second watchdog circuit configured to real-time monitor a status of the second control chip and the first heartbeat signal;
    - a second data sensing port configured to selectively read the data measured by the first sensor; and
    - a second data transmitting port configured to selectively output data read by the second data sensing port, wherein:

the first control chip is configured to read and output data measured by the first sensor when determining that the first control chip is able to operate normally;

the second control chip is configured to read and output the data measured by the first sensor when determining that the second control chip is unable to receive the first heartbeat signal and is able to operate normally; and the first control chip is configured to send a reset signal for resetting the second control chip after reading and/or outputting the data measured by the first sensor when determining that the first control chip is unable to receive the second heartbeat signal and is able to operate normally.

2. The immersion cooling system of claim 1, wherein the first management system further comprises:

a data multiplexer configured to:

receive data outputted by the first data transmitting port and the second data transmitting port; and selectively output data received from the first data transmitting port or data received from the second data transmitting port; and a flash memory configured to receive and store data outputted by the data multiplexer.

3. The immersion cooling system of claim 2, wherein:

the flash memory is further configured to store and name each piece of data according to data receiving time or store each piece of data as a metastable.

4. The immersion cooling system of claim 1, wherein the first management system further comprises:

a first storage device configured to receive and store data outputted by the first data transmitting port; and a second storage device configured to receive and store data outputted by the second data transmitting port, wherein the first storage device or the second storage device is a secure digital (SD) memory card, a secure digital input/output interface (SDIO) memory card or an embedded multimedia card (eMMC).

5. The immersion cooling system of claim 4, wherein:

the first storage device or the second storage device is further configured to store and name each piece of data according to data receiving time or store each piece of data as a metastable; or the first storage device or the second storage device adopts a redundant array of independent disks (RAID) structure.

6. The immersion cooling system of claim 1, wherein the first management system further comprises a dual-port hard drive for receiving data outputted by the first data transmitting port and the second data transmitting port, the dual-port hard drive comprising:

a first data port for receiving the data outputted by the first data transmitting port; and a second data port for receiving the data outputted by the second data transmitting port, wherein the dual-port hard drive is a serial attached small computer system interface (SAS) hard drive or a non-volatile memory express (NVMe) hard drive.

7. The immersion cooling system of claim 6, wherein:

the dual-port hard drive is further configured to store and name each piece of data according to data receiving time or store each piece of data as a metastable; or the dual-port hard drive adopts a RAID structure.

8. The immersion cooling system of claim 1, wherein:

the first control chip further comprises a first status output port for outputting a first status signal according to the status of the first control chip; and the second control chip further comprises a second status output port for outputting a second status signal according to the status of the second control chip.

9. The immersion cooling system of claim 8, further comprising:

a first alarm device configured to selectively send a first alarm signal based on the first status signal; and a second alarm device configured to selectively send a second alarm signal based on the second status signal.

10. The immersion cooling system of claim 8, further comprising:

a logic circuit configured to output a logic signal based on the first status signal and the second status signal; and an alarm device configured to selectively send an alarm signal based on the logic signal.

11. The immersion cooling system of claim 1, further comprising:

a second sensor disposed in the cooling tank and configured to measure the parameter of the cooling tank during operation; and a second management module comprising:

a third control chip, comprising:

a third heartbeat circuit configured to periodically send a third heartbeat signal;

a third watchdog circuit configured to real-time monitor a status of the third control chip, the first heartbeat signal, the second heartbeat signal and a fourth heartbeat signal;

a third data sensing port configured to selectively read data measured by the second sensor; and a third data transmitting port configured to selectively output data read by the third data sensing port; and a fourth control chip, comprising:

a fourth heartbeat circuit configured to periodically send the fourth heartbeat signal;

a fourth watchdog circuit configured to real-time monitor a status of the fourth control chip, the first heartbeat signal, the second heartbeat signal and the third heartbeat signal;

a fourth data sensing port configured to selectively read data measured by the second sensor; and a fourth data transmitting port configured to selectively output data read by the fourth data sensing port.

12. The immersion cooling system of claim 11, wherein the second management system further comprises:

a data multiplexer configured to:

receive data outputted by the third data transmitting port and the fourth data transmitting port; and selectively output data received from the third data transmitting port or data received from the fourth data transmitting port; and a flash memory configured to receive and store data outputted by the data multiplexer.

13. The immersion cooling system of claim 12, wherein:

the flash memory is further configured to store and name each piece of data according to data receiving time or store each piece of data as a metastable.

14. The immersion cooling system of claim 11, wherein the second management system further comprises:

a first storage device configured to receive and store data outputted by the third data transmitting port; and a second storage device configured to receive and store data outputted by the fourth data transmitting port, wherein the first storage device or the second storage device is a secure digital (SD) memory card, a secure digital input/output interface (SDIO) memory card or an embedded multimedia card (eMMC).

15. The immersion cooling system of claim 14, wherein:

the first storage device or the second storage device is further configured to store and name each piece of data according to data receiving time or store each piece of data as a metastable; or the first storage device or the second storage device adopts a RAID structure.

16. The immersion cooling system of claim 11, wherein the second management system further comprises a dual-port hard drive for receiving data outputted by the third data transmitting port and the fourth transmitting port, the dual-port hard drive comprising:

a first data port for receiving the data outputted by the third data transmitting port; and a second data port for receiving the data outputted by the fourth data transmitting port, wherein the dual-port hard drive is a serial attached small computer system interface (SAS) hard drive or a non-volatile memory express (NVMe) hard drive.

17. The immersion cooling system of claim 16, wherein:

the dual-port hard drive is further configured to store and name each piece of data according to data receiving time or store each piece of data as a metastable; or the dual-port hard drive adopts a RAID structure.

18. The immersion cooling system of claim 11, wherein:

the first control chip further comprises a first status output port for outputting a first status signal according to the status of the first control chip;

the second control chip further comprises a second status output port for outputting a second status signal according to the status of the second control chip;

the third control chip further comprises a third status output port for outputting a third status signal according to the status of the third control chip; and the fourth control chip further comprises a fourth status output port for outputting a fourth status signal according to the status of the fourth control chip.

19. The immersion cooling system of claim 18, further comprising:

a first alarm device configured to selectively send a first alarm signal based on the first status signal;

a second alarm device configured to selectively send a second alarm signal based on the second status signal;

a third alarm device configured to selectively send a third alarm signal based on the third status signal; and a fourth alarm device configured to selectively send a fourth alarm signal based on the fourth status signal.

20. The immersion cooling system of claim 18, further comprising:

a first logic circuit configured to output a first logic signal based on the first status signal and the second status signal;

a second logic circuit configured to output a second logic signal based on the third status signal and the fourth status signal;

a first alarm device configured to selectively send a first alarm signal based on the first logic signal; and a second alarm device configured to selectively send a second alarm signal based on the second logic signal.

21. The immersion cooling system of claim 18, further comprising:

a logic circuit configured to output a logic signal based on the first status signal, the second status signal, the third status signal and the fourth status signal; and an alarm device configured to selectively send an alarm signal based on the logic signal.

22. A method of controlling an immersion cooling process, comprising:

disposing a first sensor in a cooling tank for measuring a parameter of the cooling tank during operation;

periodically sending a first heartbeat signal using a first control chip of a first management module;

real-time monitoring a status of the first control chip and a second heartbeat signal using the first control chip of the first management module;

selectively reading data measured by the first sensor using a first data sensing port in the first control chip of the first management module;

selectively outputting data read by the first data sensing port using a first data transmitting port in the first control chip of the first management module;

periodically sending the second heartbeat signal using a second control chip of the first management module;

real-time monitoring a status of the second control chip and the first heartbeat signal using the second control chip of the first management module;

selectively reading data measured by the first sensor using a second data sensing port in the second control chip of the first management module;

selectively outputting data read by the second data sensing port using a second data transmitting port in the second control chip of the first management module; and sending a first reset signal for resetting the second control chip using the first control chip of the first management module after reading and/or outputting the data measured by the first sensor when determining that the first control chip is unable to receive the second heartbeat signal and is able to operate normally, wherein:

the first control chip reads and outputs the data measured by the first sensor when determining that the first control chip is able to operate normally; and the second control chip reads and outputs the data measured by the first sensor when determining that the second control chip is unable to receive the first heartbeat signal and is able to operate normally.

23. The method of claim 22, further comprising:

sending an alarm signal for informing that the second control chip has failed when determining that the second control chip is unable to operate normally after being reset by the first reset signal.

24. The method of claim 22, further comprising:

sending a second reset signal for resetting the first control chip using the second control chip of the first management module after reading and/or outputting the data measured by the first sensor when determining that the second control chip is unable to receive the first heartbeat signal and is able to operate normally; and reading and outputting the data measured by the first sensor using the first control chip and stopping reading and outputting the data measured by the first sensor using the second control chip when determining that the first control chip is able to operate normally after being reset by the second reset signal.

25. The method of claim 24, further comprising:
sending an alarm signal for informing that the first control chip has failed when determining that the first control chip is unable to operate normally after being reset by the second reset signal.

26. The method of claim 22, further comprising:
sending an alarm signal for informing that the first control chip and the second control chip have failed when determining that the first control chip and the second control chip are both unable to operate normally.

27. The method of claim 22, further comprising:
disposing a second sensor in the cooling tank for measuring the parameter of the cooling tank during operation;
periodically sending a third heartbeat signal using a third control chip of a second management module;
real-time monitoring a status of the third control chip, the first heartbeat signal, the second heartbeat signal and a fourth heartbeat signal using the third control chip of the second management module;
selectively reading data measured by the second sensor using a third data sensing port in the third control chip of the second management module;
selectively outputting data read by the third data sensing port using a third data transmitting port in the third control chip of the second management module;
periodically sending a fourth heartbeat signal using a fourth control chip of the second management module;
real-time monitoring a status of the fourth control chip, the first heartbeat signal, the second heartbeat signal and the third heartbeat signal using the fourth control chip of the second management module;
selectively reading data measured by the second sensor using a fourth data sensing port in the fourth control chip of the second management module; and
selectively outputting data read by the fourth data sensing port using a fourth data transmitting port in the fourth control chip of the second management module, wherein:
the third control chip reads and outputs the data measured by the second sensor when determining that the first control chip and the second control chip are both unable to operate normally but the third control chip is able to operate normally; and
the fourth control chip reads and outputs the data measured by the second sensor when determining that the first control chip, the second control chip and the third control chip are unable to operate normally but the fourth control chip is able to operate normally.

28. The method of claim 27, further comprising:
sending a third reset signal for resetting the fourth control chip using the third control chip of the second management module after reading and/or outputting the data measured by the second sensor when determining that the third control chip is unable to receive the fourth heartbeat signal and is able to operate normally.

29. The method of claim 28, further comprising:
sending an alarm signal for informing that the fourth control chip has failed when determining that the fourth control chip is unable to operate normally after being reset by the third reset signal.

30. The method of claim 27, further comprising:
sending a fourth reset signal for resetting the third control chip using the fourth control chip of the second management module after reading and/or outputting the data measured by the second sensor when determining that the fourth control chip is unable to receive the third heartbeat signal and is able to operate normally; and
reading and outputting the data measured by the second sensor using the third control chip and stopping reading and outputting the data measured by the second sensor using the fourth control chip when determining that the third control chip is able to operate normally after being reset by the fourth reset signal.

31. The method of claim 30, further comprising:
sending an alarm signal for informing that the third control chip has failed when determining that the third control chip is unable to operate normally after being reset by the fourth reset signal.

32. The method of claim 27, further comprising:
sending an alarm signal for informing that the third control chip and the fourth control chip have failed when determining that the third control chip and the fourth control chip are both unable to operate normally.

33. The method of claim 27, further comprising:
sending an alarm signal for informing that the first through the fourth control chips have failed when determining that the first through the fourth control chips are unable to operate normally.

34. An immersion cooling system, comprising:
a cooling tank;
a first sensor and a second sensor disposed in the cooling tank and configured to measure parameters of the cooling tank during operation;
a first management module, comprising:
a first control chip, comprising:
a first heartbeat circuit configured to periodically send a first heartbeat signal;
a first watchdog circuit configured to real-time monitor a status of the first control chip and a second heartbeat signal;
a first data sensing port configured to selectively read data measured by the first sensor; and
a first data transmitting port configured to selectively output data read by the first data sensing port; and
a first storage device configured to receive and store data outputted by the first data transmitting port; and
a second management module, comprising:
a second control chip, comprising:
a second heartbeat circuit configured to periodically send the second heartbeat signal;
a second watchdog circuit configured to real-time monitor a status of the second control chip and the first heartbeat signal;
a second data sensing port configured to selectively read the data measured by the second sensor; and
a second data transmitting port configured to selectively output data read by the second data sensing port; and
a second storage device configured to receive and store data outputted by the second data transmitting port, wherein:
the first control chip is configured to read and output data measured by the first sensor when determining that the first control chip is able to operate normally;
the second control chip is configured to read and output the data measured by the first sensor when determining that the second control chip is unable to receive the first heartbeat signal and is able to operate normally; and
the first control chip is configured to send a reset signal for resetting the second control chip after reading and/or outputting the data measured by the first sensor when determining that the first control chip is unable to receive the second heartbeat signal and is able to operate normally.

35. The immersion cooling system of claim 34, wherein:

the first control chip further comprises a first status output port for outputting a first status signal according to the status of the first control chip; and the second control chip further comprises a second status output port for outputting a second status signal according to the status of the second control chip.

36. The immersion cooling system of claim 35, further comprising:

a first alarm device configured to selectively send a first alarm signal based on the first status signal; and a second alarm device configured to selectively send a second alarm signal based on the second status signal.

37. The immersion cooling system of claim 35, further comprising:

a logic circuit configured to output a logic signal based on the first status signal and the second status signal; and an alarm device configured to selectively send an alarm signal based on the logic signal.

38. A method of controlling an immersion cooling process, comprising:

disposing a first sensor and a second sensor in a cooling tank for measuring parameters of the cooling tank during operation;

periodically sending a first heartbeat signal using a first control chip of a first management module;

real-time monitoring a status of the first control chip and a second heartbeat signal using the first control chip of the first management module;

selectively reading data measured by the first sensor using a first data sensing port in the first control chip of the first management module;

selectively outputting data read by the first data sensing port using a first data transmitting port in the first control chip of the first management module;

periodically sending the second heartbeat signal using a second control chip of a second management module;

real-time monitoring a status of the second control chip and the first heartbeat signal using the second control chip of the second management module;

selectively reading data measured by the second sensor using a second data sensing port in the second control chip of the second management module;

selectively outputting data read by the second data sensing port using a second data transmitting port in the second control chip of the second management module; and sending a first reset signal for resetting the second control chip using the first control chip of the first management module after reading and/or outputting the data measured by the first sensor when determining that the first control chip is unable to receive the second heartbeat signal and is able to operate normally, wherein:

the first control chip reads and outputs the data measured by the first sensor when determining that the first control chip is able to operate normally; and the second control chip reads and outputs the data measured by the second sensor when determining that the second control chip is unable to receive the first heartbeat signal and is able to operate normally.

39. The method of claim 38, further comprising:

sending an alarm signal for informing that the second control chip has failed when determining that the second control chip is unable to operate normally after being reset by the first reset signal.

40. The method of claim 38, further comprising:

sending a second reset signal for resetting the first control chip of the first management module using the second control chip of the second management module after reading and/or outputting the data measured by the second sensor when determining that the second control chip is unable to receive the first heartbeat signal and is able to operate normally; and reading and outputting the data measured by the first sensor using the first control chip and stopping reading and outputting the data measured by the second sensor using the second control chip when determining that the first control chip is able to operate normally after being reset by the second reset signal.

41. The method of claim 40, further comprising:

sending an alarm signal for informing that the first control chip has failed when determining that the first control chip is unable to operate normally after being reset by the second reset signal.

42. The method of claim 38, further comprising:

sending an alarm signal for informing that the first control chip and the second control chip have failed when determining that the first control chip and the second control chip are both unable to operate normally.

* * * * *